(12) United States Patent
Udrea et al.

(10) Patent No.: US 11,217,687 B2
(45) Date of Patent: Jan. 4, 2022

(54) POWER SEMICONDUCTOR DEVICE WITH AN AUXILIARY GATE STRUCTURE

(71) Applicant: Cambridge Enterprise Limited, Cambridge (GB)

(72) Inventors: Florin Udrea, Cambridge (GB); Loizos Efthymiou, Cambridge (GB); Giorgia Longobardi, Cambridge (GB)

(73) Assignee: CAMBRIDGE ENTERPRISE LIMITED, Cambridge (GB)

( * ) Notice: Subject to any disclaimer, the term of this patent is extended or adjusted under 35 U.S.C. 154(b) by 26 days.

(21) Appl. No.: 16/630,321

(22) PCT Filed: Jul. 13, 2018

(86) PCT No.: PCT/GB2018/051999
§ 371 (c)(1),
(2) Date: Jan. 10, 2020

(87) PCT Pub. No.: WO2019/012293
PCT Pub. Date: Jan. 17, 2019

(65) Prior Publication Data
US 2020/0168599 A1     May 28, 2020

(30) Foreign Application Priority Data

Jul. 14, 2017   (GB) .................................... 1711361

(51) Int. Cl.
*H01L 29/778*     (2006.01)
*H01L 27/06*      (2006.01)
(Continued)

(52) U.S. Cl.
CPC ...... *H01L 29/7786* (2013.01); *H01L 21/8252* (2013.01); *H01L 27/0605* (2013.01);
(Continued)

(58) Field of Classification Search
None
See application file for complete search history.

(56) References Cited

U.S. PATENT DOCUMENTS 5,939,941 A    8/1999  Nair et al.
8,017,978 B2   9/2011  Lidow et al.
(Continued)

FOREIGN PATENT DOCUMENTS

EP    2390919 A2    11/2011
EP    2597767 A2     5/2013
(Continued)

OTHER PUBLICATIONS

O. Ambacher et al., "Two-dimensional electron gases induced by spontaneous and piezoelectric polarization charges in N- and Ga-face AlGaN/GaN heterostructures". Journal of Applied Physics 85, 3222, 1999, http:dx.doi.org/10.1063/1.369664, 13 pages.
(Continued)

*Primary Examiner* — Grant S Withers
(74) *Attorney, Agent, or Firm* — Tucker Ellis LLP

(57) ABSTRACT

The disclosure relates to power semiconductor devices in GaN technology. The disclosure proposes an integrated auxiliary gate terminal (15) and a pulldown network to achieve a normally-off (E-Mode) GaN transistor with threshold voltage higher than 2V, low gate leakage current and enhanced switching performance. The high threshold voltage GaN transistor has a high-voltage active GaN device (205) and a low-voltage auxiliary GaN device (210) wherein the high-voltage GaN device has the gate connected to the source of the integrated auxiliary low-voltage GaN transistor and the drain being the external high-voltage drain terminal and the source being the external source terminal, while the low-voltage auxiliary GaN transistor has the gate (first auxiliary electrode) connected to the drain (second auxiliary electrode) functioning as an external gate terminal. In other
(Continued)

embodiments a pull-down network for the switching-off of the high threshold voltage GaN transistor is formed by a diode, a resistor, or a parallel connection of both connected in parallel with the low-voltage auxiliary GaN transistor.

20 Claims, 22 Drawing Sheets

(51) Int. Cl.

| | |
|---|---|
| H01L 49/02 | (2006.01) |
| H01L 27/085 | (2006.01) |
| H01L 29/861 | (2006.01) |
| H01L 27/07 | (2006.01) |
| H01L 21/8252 | (2006.01) |
| H01L 29/205 | (2006.01) |
| H01L 29/66 | (2006.01) |
| H01L 29/872 | (2006.01) |
| H01L 29/10 | (2006.01) |
| H01L 29/06 | (2006.01) |
| H01L 29/40 | (2006.01) |
| H01L 29/423 | (2006.01) |
| H01L 29/417 | (2006.01) |
| H01L 29/20 | (2006.01) |

(52) U.S. Cl.
CPC ...... *H01L 27/0629* (2013.01); *H01L 27/0738* (2013.01); *H01L 27/085* (2013.01); *H01L 28/20* (2013.01); *H01L 29/205* (2013.01); *H01L 29/66462* (2013.01); *H01L 29/861* (2013.01); *H01L 29/872* (2013.01); *H01L 27/0727* (2013.01); *H01L 29/0649* (2013.01); *H01L 29/1066* (2013.01); *H01L 29/2003* (2013.01); *H01L 29/402* (2013.01); *H01L 29/41758* (2013.01); *H01L 29/41766* (2013.01); *H01L 29/42316* (2013.01)

(56) References Cited

U.S. PATENT DOCUMENTS

| | | |
|---|---|---|
| 8,470,652 B1 | 6/2013 | Brown et al. |
| 9,882,553 B2 | 1/2018 | Kwan et al. |
| 10,170,973 B1 | 1/2019 | Hirose |
| 10,374,591 B2 | 8/2019 | Ramabhadran et al. |
| 10,411,681 B2 | 9/2019 | Kwan et al. |
| 2002/0113274 A1 | 8/2002 | Iwagami |
| 2007/0247211 A1 | 10/2007 | Brindle |
| 2009/0065810 A1 | 3/2009 | Honea |
| 2010/0258843 A1 | 10/2010 | Lidow |
| 2010/0321363 A1 | 12/2010 | Morita et al. |
| 2011/0193171 A1 | 8/2011 | Yamagiwa et al. |
| 2011/0210377 A1 | 9/2011 | Haeberlen |
| 2011/0248283 A1 | 10/2011 | Cao |
| 2011/0309372 A1 | 12/2011 | Xin et al. |
| 2012/0228625 A1 | 9/2012 | Ikeda |
| 2012/0292665 A1 | 11/2012 | Marino et al. |
| 2012/0306545 A1 | 12/2012 | Machida et al. |
| 2013/0009165 A1 | 1/2013 | Park et al. |
| 2013/0099247 A1 | 4/2013 | Palacios et al. |
| 2013/0181215 A1 | 7/2013 | Adekore |
| 2013/0249622 A1 | 9/2013 | Honea et al. |
| 2014/0001557 A1 | 1/2014 | Mishra |
| 2014/0015066 A1 | 1/2014 | Wu |
| 2014/0048850 A1 | 2/2014 | Jeon |
| 2014/0049296 A1 | 2/2014 | Jeon et al. |
| 2014/0061647 A1 | 3/2014 | Werner |
| 2014/0084966 A1 | 3/2014 | Takemae |
| 2014/0103969 A1 | 4/2014 | Jeon |
| 2014/0138701 A1 | 5/2014 | Huang et al. |
| 2014/0159119 A1 | 6/2014 | Derluyn |
| 2014/0327043 A1 | 11/2014 | Kim et al. |
| 2015/0108547 A1 | 4/2015 | Hwang |
| 2015/0171750 A1 | 6/2015 | Zeng et al. |
| 2015/0243775 A1 | 8/2015 | Haeberlen et al. |
| 2015/0357321 A1 | 12/2015 | Ikeda |
| 2016/0172284 A1 | 6/2016 | Cho |
| 2016/0322466 A1 | 11/2016 | Simin |
| 2016/0373106 A1 | 12/2016 | Shah et al. |
| 2017/0025405 A1 | 1/2017 | Jeon et al. |
| 2017/0098649 A1* | 4/2017 | Ohori ................. H01L 27/0629 |
| 2017/0110448 A1 | 4/2017 | Prechtl |
| 2017/0133498 A1* | 5/2017 | Okawa .................... H01L 29/36 |
| 2017/0148912 A1 | 5/2017 | Chu |
| 2017/0194477 A1 | 7/2017 | Lin et al. |
| 2017/0345920 A1 | 11/2017 | Nagahisa |
| 2018/0145684 A1 | 5/2018 | Chang et al. |
| 2018/0151568 A1 | 5/2018 | Sato et al. |
| 2018/0182878 A1 | 6/2018 | Morvan |
| 2018/0374943 A1 | 12/2018 | Liu et al. |
| 2019/0312137 A1 | 10/2019 | Shibib et al. |
| 2020/0007119 A1 | 1/2020 | Li et al. |
| 2020/0357906 A1 | 11/2020 | Udrea et al. |
| 2020/0357909 A1 | 11/2020 | Udrea et al. |
| 2021/0226621 A1 | 7/2021 | Chuang |

FOREIGN PATENT DOCUMENTS

| | | |
|---|---|---|
| KR | 1020160083256 A | 7/2016 |
| WO | 2012055570 A1 | 5/2012 |
| WO | 2019012293 A1 | 1/2019 |

OTHER PUBLICATIONS

Bin Lu et al., "High-Performance Integrated Dual-Gate AlGaN/GaN Enhancement-Mode Transistor", IEEE Electron Device Letters, vol. 31, No. 9, Sep. 2010, pp. 990-992, 3 pages.

L. Efthymiou et al., "On the physical operation and optimization of the p-GaN gate in normally-off GaN HEMT devices", Appl. Phys. Lett. 110, 123502, 2017, 6 pages.

Loizos Efthymiou et al., "On the Source of Oscillatory Behaviour during Switching of Power Enhancement Mode GaN HEMTs", Energies, 2017, 11 pages.

Peijie Feng et al., "Design of Enhancement Mode Single-gate and Doublegate Multi-channel GaN HEMT with Vertical Polarity Inversion Heterostructure", Proceedings of The 25th International Symposium on Power Semiconductor Devices & ICs, Kanazawa, 4 pages.

GaN Systems Inc., "GN001 Application Guide Design with GaN Enhacement mode HEMT", Feb. 28, 2018, 45 pages.

GaN Systems Inc., Bottom-side cooled 650 V E-mode GaN transistor Preliminary Datasheet, 2009-2017, 4 pages.

Injun Hwang et al., "1.6kV, 2.9 mΩ cm2 Normally-off p-GaN HEMT Device", Proceedings of the 2012 24th International Symposium on Power Semiconductor Devices and ICs Jun. 3-7, 2012—Bruges, Belgium, pp. 41-44, 15 pages.

Infineon, "MOSFET Metal Oxide Semiconductor Field Effect Transistor", CoolMOS C7, Apr. 29, 2013, 4 pages.

Man Ho Kwan et al., "CMOS-Compatible GaN-on-Si Field-Effect Transistors for High Voltage Power Applications", pp. 17.6.1-17.6.4, 2014, 3 pages.

Finella Lee et al., "Impact of Gate Metal on the Performance of p-GaN/AlGaN/GaN High Electron Mobility Transistors", pp. 232-234, IEEE Eletron Device Letters, vol. 36, No. 3, Mar. 2015, 3 pages.

Silvia Lenci et al., "Au-Free AlGaN/GaN Power Diode on 8-in Si Substrate With Gated Edge Termination", pp. 1035-1037, IEEE Electron Device Letters, vol. 34, No. 8, Aug. 2013.

Umesh K. Mishra et al., "GaN-Based RF Power Devices and Amplifiers", Proceedings of the IEEE, vol. 96, No. 2, Feb. 2008.

Tohru Oka et al., "AlGaN/GaN Recessed MIS-Gate HFET With High-Threshold-Voltage Normally-Off Operation for Power Electronics Applications", IEEE Electron Device Letters, vol. 29, No. 7, Jul. 2008.

Hideyuki Okita et al., "Through Recessed and Regrowth Gate Technology for Realizing Process Stability of GaN-GITs", Proceed-

(56) References Cited

OTHER PUBLICATIONS ings of the 2016 28th International Symposium on Power Semiconductor Devices and ICs (ISPSD), Jun. 12-16, 2016, Prague, Czech Republic.

Yasuhiro Uemoto et al., "Gate Injection Transistor (GIT)—A Normally-Off AlGaN/GaN Power Transistor Using Conductivity Modulation", IEEE Transactions on Electron Devices, vol. 54, No. 12, Dec. 2007.

Michael J. Uren et al., "Buffer Design to Minimize Current Collapse in GaN/AlGaN HFETs", IEEE Transactions on Electron Devices, vol. 59, No. 12, Dec. 2012.

Wataru Saito et al., "Recessed-Gate Structure Approach Toward Normally Off High-Voltage AlGaN/GaN HEMT for Power Electronics Applications", IEEE Transactions On Electron Devices, vol. 53, No. 2, Feb. 2006.

Yong Cai et al., "High-Performance Enhancement-Mode AlGaN/GaN HEMTs Using Fluoride-Based Plasma Treatment", IEEE Electron Device Letters, vol. 26, No. 7, Jul. 2005.

Tsai Jung-Ruey et al., "Engineered threshold voltage in AlGaN/GaN HEMTs for normally-off operation", 2015 International Symposium on Next-Generation Electronics (ISNE), IEEE, May 4, 2015, pp. 1-2, XP032789065, DOI: 10.1109/ISNE.2015.7131989 section "Methodology"; figure 4, 2 pages.

Yu, Guohao, et al., "Dynamic Characterizations of AlGaN/GaN HEMTs with Field Plates Using a Double-Gate Structure", IEEE, vol. 34, No. 2, Feb. 2013, p. 217-219, 3 pages.

International Search Report and Written Opinion from correlating International Application No. PCT/GB2018/051999, dated Nov. 27, 2018, 19 pages.

Pending claims from U.S. Appl. No. 16/405,619, amended on Nov. 2, 2019, 6 pages.

Wael et al., "AlGan HEMT based digital circuits on 3C—SiC(111)/Si(111) pseudosubstrates" Phys. Status Solidi A 214, No. 4, 1600416 (2017), 6 pages.

International Search Report and Written Opinion from Corresponding International Application No. PCT/EP2020/062710, dated Aug. 24, 2020, 22 pages.

\* cited by examiner

POWER SEMICONDUCTOR DEVICE WITH AN AUXILIARY GATE STRUCTURE

TECHNICAL FIELD

The present disclosure relates to a power semiconductor device, for example to a hetero-structure aluminium gallium nitride/gallium nitride (AlGaN/GaN) high electron mobility transistor (HEMT) or rectifier. The power semiconductor device includes a double gate structure.

BACKGROUND

A power semiconductor device is a semiconductor device used as a switch or rectifier in power electronics (e.g., dc to ac inverter for motor control or dc to dc converter for switched-mode power supplies). A power semiconductor device is usually used in "commutation mode" (i.e., it is either on or off), and therefore has a design optimized for such usage.

In general, a power device has a rated voltage (i.e. the potential difference that the device has to withstand in the off-state between its main terminals) of over 20 V and conducts more than 100 mA during on-state. More commonly the rating of a power device is above 60V and above 1 A. These values make the power devices very different from the low power devices, which operate with voltages below 5V and typical currents of under 1 mA and more commonly in the range of μAs or sub μAs. Another differentiation between power devices and other types of devices such as low power or RF, is that they operate mainly with large signals and they behave like switches. An exception to that is found in high voltage or power amplifiers, which use specialised power transistors.

Silicon bipolar junction transistors (BJT), metal-oxide-semiconductor field effect transistors (MOSFET) and insulated gate bipolar transistors (IGBT) are common types of power semiconductor switching devices. Their application areas range from portable consumer electronics, domestic appliances, hybrid and electric cars, motor control and power supplies to RF and microwave circuits and telecommunication systems. Gallium Nitride (GaN) has increasingly been considered as a very promising material for use in the field of power devices with the potential to lead to increased power density, reduced on-resistance, and high frequency response. The wide band gap of the material ($E_g$=3.39 eV) results in high critical electric field ($E_c$=3.3 MV/cm) which can lead to the design of devices with a shorter drift region, and therefore lower on-state resistance, if compared to a silicon-based device with the same breakdown voltage [1]. The use of an AlGaN/GaN heterostructure also allows the formation of a two-dimensional electron gas (2DEG) at the hetero-interface where carriers can reach very high mobility ($\mu$=2000 cm$^2$/(Vs)) values [1]. In addition, the piezopolarization charge present at the AlGaN/GaN heterostructure, results in a high electron density in the 2DEG layer (e.g. $1\times10^{13}$ cm$^{-2}$). These properties allow the development of High Electron Mobility Transistors (HEMTs) and Schottky barrier diodes with very competitive performance parameters [2],[3]. An extensive amount of research has focused on the development of power devices using AlGaN/GaN heterostructures.

However, the 2DEG which inherently exists at the AlGaN/GaN hetero-interface creates a challenge when attempting the design of normally-off rather than normally-on devices. Nonetheless, as normally-off transistors are preferable in most power electronic applications several methods have been proposed which can lead to enhancement mode devices, among them the use of metal insulator semiconductor structures [4], use of fluorine treatment [5], recessed gate structures [6] and use of a p-type cap layer [7][8]. Due to the relative maturity and controllability in the epitaxial growth of pGaN layers compared to the other techniques, pGaN/AlGaN/GaN HEMTs are considered the leading structure for commercialization.

FIG. 1 shows schematically the cross section in the active area of a state of the art pGaN HEMT. The device shown is a lateral three-terminal device with an AlGaN/GaN hetero-structure grown epitaxially on a standard silicon wafer 4. A transition layer 3 is used to allow a high quality GaN layer 2 to be grown despite the significant lattice mismatch between GaN and Si. Carbon p-type doping is often added in the GaN layer [9]. Finally, a thin cap GaN layer 11 is typically added to form the gate with a Magnesium (Mg) p-type doping density greater than $1\times10^{19}$ cm$^{-3}$. A TCAD model of the device shown in FIG. 1 has been developed for comparison with the proposed disclosure.

A typical pGaN gate device has a threshold voltage of ~1.5-2V and gate turn-on bias voltage of ~8V. Threshold voltage and gate turn-on voltage in enhancement mode GaN devices are of great interest as problems such as unwanted device turn-on when the device is supposed to be off may occur in operation if threshold voltage is low. Secondly, gate turn-on may be a problem due to the non-insulated gate structure.

In the state of the art device a trade-off exists between the threshold voltage of the device and the carrier density in the 2DEG of the device and consequently the device on-state resistance. A previous study has shown that for a pGaN doping greater than $1\times10^{19}$ cm$^{-3}$ the threshold voltage cannot be significantly altered by the use of a different gate metal or the thickness of the pGaN layer [10]. A narrow window of operation is therefore specified in these devices (with gate voltages in the range of 4V to 7V with respect to the source) [11] unlike their silicon counterparts [12]. The lower boundary is defined by the gate bias needed to fully form the channel (2DEG) below the gate (this is referred to as the threshold voltage, Vth), and the upper boundary is limited by the point at which the gate turns on and considerable current starts flowing through it.

Another area of interest in AlGaN/GaN HEMTs is their fast switching capability. The high mobility of carriers in the 2DEG and a shorter drift region for a given breakdown due to higher critical electric field can lead to very low drift region charge, Qgd. Furthermore, the device gate charge Qg is about an order of magnitude lower than corresponding state of the art silicon devices [11], [12]. Therefore, the GaN HEMTs can switch at much higher speeds than silicon MOSFETs. While this is beneficial in many applications, it can lead to unwanted oscillations due to parasitic components present both at the device and circuit level [13]. A possible solution proposed in order to avoid the oscillatory behaviour is to add an external gate resistance to the device in order to reduce the dV/dt and dI/dt rate observed [13].

In [14], an attempt to enlarge the window of operation defined by the threshold voltage and the opening of the pGaN/AlGaN junction has been made by varying the composition of the gate metal. This attempt resulted to be unsuccessful as discussed in [10] where it is showed that for a pGaN doping greater than $1\times10^{19}$ cm$^{-3}$ the threshold voltage cannot be significantly altered using a different gate metal or by altering the thickness of the pGaN layer.

In [16] a higher Vth on a P-gate technology has been obtained via 'Through Recessed and Regrowth Gate (TRRG)' technique. This process technology is based on a complete removal of the AlGaN barrier layer and subsequent regrowth of it by epitaxial regrowth. This demonstrates more stable threshold voltages at increasing temperatures and the possibility to reach Vth as high as 2.3V by controlling the thickness of the AlGaN layer. Although this is an interesting process technology to obtain a stable threshold voltage, it does affect the Ron when a Vth>2V is achieved. Moreover, the high Vth solution presented in [16] does not address the problem of the Rg-related oscillations during the fast switching of the high voltage transistor, nor the high gate leakage of the pGaN gate technology.

In [17] an integrated double-gate technology for achieving high Vth (>2.8V) is demonstrated. The double-gate technology suggested in [17] is based on the integration of a high voltage normally-on (D-Mode) and low voltage normally-off (E-Mode) GaN transistors. In this configuration however, the two transistors are in series and the overall on-state resistance will be therefore be affected by the series contribution of the on-state resistance of the low voltage device.

Other double-gate technologies are present in literature and they are so called as they feature a second gate electrode either on top of the gate passivation layer [18] or buried into the heterostructures stack [19]. These devices mainly aim at improving the dynamic performance of the transistors by alleviating the current collapse phenomenon. The current collapse phenomenon is in fact a current reduction in the on-state, when the device is repeatedly stressed to high voltages in the off-state, An attempt to increase the Vth of a normally-off (enhancement mode—E-Mode) GaN transistor using a circuit configuration with diodes and a second gate electrode is made in [20]. In this document the diodes are used as voltage shifters and are connected in series with the gate of the high-voltage GaN devices. A device where the voltage shifter is achieved with a transistor is also described. In this particular case, however, the drain terminal of the voltage-shifter-transistor is connected with the high-voltage drain terminal of the GaN device. The implication of such connection is that the driving device will have to sustain the high voltage in blocking mode and therefore be designed as a high voltage transistor with a longer drift region than for a low-voltage device. The device will therefore have increased area consumption and reliability of this additional transistor has to be taken into account. In addition in [20] no mention is made of the upper boundary limitation.

SUMMARY

The disclosure suggests a specific solution for a p-gate GaN E-Mode transistors for (i) concomitantly reducing the gate leakage current and increasing the threshold voltage, thus increasing the gate voltage operation window, (ii) limiting the oscillation during the switching of the configuration, (iii) improving the switching performance of the overall configuration via appositely designed and integrated pull-down networks.

According to this disclosure we propose a GaN power device that has the ability of a high threshold voltage, a significantly large gate voltage operation range with less or no risk of p-GaN junction opening, and oscillation-free or oscillation-reduced switching behaviour. The details of this disclosure will be discussed considering but not limited to a pGaN gate E-Mode technology.

GaN transistors that utilise this disclosure are intended but not limited to applications in low to medium voltage range. The lower voltage capability devices (<200V but higher than 20V) would be suitable for point-of-load applications i.e. low voltage DC-DC converters for IT or consumer electronics applications. Such devices can also be used in linear electronics to increase efficiency, A large market potential however exists at the 600V range for applications such as power factor correction (PFC), uninterrupted power supplies (UPS), motor drives, and photovoltaic (PV) system inverters. 600V GaN devices can also find use as chargers in hybrid electric vehicles (HEV) and/or electric vehicles (EV), a market which is growing at an enormous pace. GaN transistors with breakdown capabilities up to 1.2 kV and power ratings which can reach 7.2 kW can lead to GaN transistors being used in EV and HEV converters and inverters where the high frequency of operation will allow a reduction in system size, a parameter which is significant when considering mobile systems. Ultimately, if the power rating is extended enough GaN transistors could find application in wind turbines (1.7 kV). Recent applications which require reliable operation in the MHz regime such as wireless charging in both IT (mobile phones, laptop) and automotive (EV, HEV) sectors may be very suitable for this disclosure. Additionally, applications beyond power conversion are also envisioned such as class D audio amplifiers.

Broadly speaking, the disclosure relates to power semiconductor devices using GaN technology. The disclosure proposes an integrated auxiliary gate terminal and a pull-down network to achieve a normally-off (E-Mode) GaN transistor with threshold voltage higher than 2V, low gate leakage current and possibly enhanced switching performance. The high threshold voltage GaN transistor has a high-voltage active GaN device and an auxiliary GaN device, which could be preferably a low-voltage device, wherein the high-voltage GaN device has the gate connected to the source of the integrated auxiliary GaN transistor and the drain being the external high-voltage drain terminal and the source being the external source terminal, while the auxiliary GaN transistor has the gate (first auxiliary electrode) connected to the drain (second auxiliary electrode) functioning as an external gate terminal. In other embodiments a pull-down network for the switching-off of the high threshold voltage GaN transistor is formed by a diode, a resistor, or a parallel connection of both connected in parallel with the auxiliary GaN transistor.

Since the auxiliary GaN Transistor would preferably be a low voltage device, its source and the drain terminals could be interchanged as they are commonly made in symmetrical (or similar) way. By a low-voltage device, we mean a device that can typically have a rated breakdown below 20V and limited current capability (under 100 mA). However, it should be understood that the auxiliary gate could also be a high power or high voltage device, although this may add cost and complexity.

Most of the embodiments according to this disclosure described here are concerned with an integrated auxiliary transistor, whereby the auxiliary transistor and the active transistor are made on the same substrate (in the same chip). While the integration of the two could be advantageous for several reasons, such as fewer pads, low area consumption, compact size, lower cost and lower complexity, the auxiliary transistor could also be made on a separate substrate and connected to the active transistor in a discrete or hybrid way. The auxiliary and the active transistors could be placed side by side in the same package or module or discretely connected on a board and not necessarily integrated within the same GaN chip.

According to one aspect of the present disclosure, there is provided a III-nitride semiconductor based heterojunction power device, comprising:

an active heterojunction transistor formed on a substrate, the active heterojunction transistor comprising:
- a first III-nitride semiconductor region comprising a first heterojunction comprising an active two dimensional carrier gas;
- a first terminal operatively connected to the III-nitride semiconductor region;
- a second terminal laterally spaced from the first terminal and operatively connected to the III-nitride semiconductor region;
- an active gate region formed over the III-nitride semiconductor region, the active gate region being formed between the first terminal and the second terminal;

an auxiliary heterojunction transistor formed on the said substrate or a further substrate, the auxiliary heterojunction transistor comprising:
- a second III-nitride semiconductor region comprising a second heterojunction comprising an auxiliary two dimensional carrier gas;
- a first additional terminal operatively connected to the second III-nitride semiconductor region;
- a second additional terminal laterally spaced from the first additional terminal and operatively connected to the second III-nitride semiconductor region;
- an auxiliary gate region formed over the second III-nitride semiconductor region, the auxiliary gate region being formed between the first additional terminal and the second additional terminal;

wherein the first additional terminal is operatively connected with the auxiliary gate region, and wherein the second additional terminal is operatively connected with the active gate region, wherein the auxiliary heterojunction transistor is configured to (or the addition of the auxiliary heterojunction transistor) result in an increase in a threshold voltage of said heterojunction power device and/or an increase in an operation voltage range of the first additional terminal.

Here the term "operatively connected" means the terminals are electrically connected. In other words, the first additional terminal and the auxiliary gate are electrically connected, and the second additional terminal and the active gate region are electrically connected. Furthermore, in one embodiment, the first terminal is a source terminal of the active transistor, and the second terminal is a drain terminal of the active transistor. On the other hand, the first additional terminal is a drain terminal of the auxiliary transistor and the second additional terminal is a source terminal of the auxiliary transistor. In embodiments, the connected first additional terminal and the auxiliary gate region form a high voltage terminal (or form an external gate terminal) in which a relatively higher voltage is applied compared to the second additional terminal. Therefore, the second additional terminal can be termed as a low voltage terminal of the auxiliary transistor. Here the term "III-nitride semiconductor region" generally refers to an entire region comprising a GaN layer and an AlGaN layer formed on the GaN layer. The two dimensional carrier gas is generally formed at the interface between the GaN layer and the AlGaN layer within the III-nitride semiconductor region. In embodiments, the two dimensional carrier gas refers to two dimensional electron gas (2DEG) or two dimensional hole gas (2DHG).

When integrated on the same substrate, the heterojunction power device may further comprise an isolator region between the active heterojunction transistor and the auxiliary heterojunction transistor. The isolator region separates the active two dimensional carrier gas and the auxiliary two dimensional carrier gas. Isolator region may separate the first and second III-nitride semiconductor regions.

In use, when the first additional terminal and the auxiliary gate region may be biased at a potential (or a voltage), a carrier density in a portion of the auxiliary two dimensional carrier gas underneath the auxiliary gate region is controlled such that an auxiliary two dimensional carrier gas connection is established between the first and second additional terminals. Generally, there is a two dimensional electron gas (2DEG) formed underneath the first and second additional terminals. When a voltage is applied to the auxiliary gate region (or the high voltage terminal), it controls the carrier density in the 2DEG underneath the auxiliary gate so that a 2DEG connection is formed between the 2DEG underneath the first and second additional terminals.

The active gate region may be configured to be switched on through the auxiliary two dimensional carrier gas (e.g. 2DEG) connection between the first and second additional terminals. The resistance variation from the 2DEG connection underneath the auxiliary gate region enables to turn on the active gate as well. The auxiliary 2DEG connection may serve as an internal resistance to the active gate region.

The first additional terminal and the auxiliary gate region may be configured such that a part of the potential is used to form the auxiliary 2DEG connection and a further part of potential is used to switch on the active gate region.

The first III-nitride semiconductor region may comprise an active aluminium gallium nitride (AlGaN) layer directly in contact with the first terminal, the active gate region and the second terminal.

The second III-nitride semiconductor region may comprise an auxiliary aluminium gallium nitride (AlGaN) layer directly in contact with the first additional terminal, the auxiliary gate region and the second additional terminal.

The thickness of the active AlGaN layer and the auxiliary AlGaN layer may be the same or different.

The doping concentration of the active AlGaN layer and the auxiliary AlGaN layer may be the same or different.

The aluminium mole fraction of the active AlGaN layer and the auxiliary AlGaN layer may be the same or different.

The active gate region may comprise a p-type gallium nitride (pGaN) material. The metal contact on the active pGaN gate could be Schottky or ohmic. Alternatively, the active gate region may comprise a recessed Schottky contact.

The auxiliary gate region may comprise a p-type gallium nitride (pGaN) material. The metal contact on the auxiliary pGaN gate could be Schottky or ohmic. Alternatively, the auxiliary gate region may comprise a recessed Schottky contact. It will be appreciated that, in embodiments, the active gate region may have the pGaN material and the auxiliary gate region may have the recessed Schottky gate. It is also possible that the active gate region may have the Schottky gate and the auxiliary gate region may have the pGaN material.

The first terminal, the second terminal, the first additional terminal and the second additional terminal may each comprise a surface ohmic contact. Alternatively, the first terminal, the second terminal, the first additional terminal and the second additional terminal may each comprise a recessed ohmic contact.

The auxiliary gate region may comprise a field plate extending towards the first additional terminal and wherein the field plate extends over a field oxide region.

The power device may have an interdigitated layout in which a gate metal pad is directly connected with the auxiliary gate region and the first additional terminal, and the active gate region comprises gate fingers connected with the second additional terminal. Alternatively, the device may have an interdigitated layout in which the auxiliary gate region, the first additional terminal and the second additional terminal are placed below a source metal pad. Advantageously, no additional wafer area would be needed to include the auxiliary gate structure compared to a state of the art design.

In embodiments, the second additional terminal and the active gate region may be connected in a third dimension of the device.

The heterojunction power device may further comprise an additional auxiliary heterojunction transistor according to the arrangement of the auxiliary heterojunction transistor as described above. The heterojunction device may comprise a further isolator region between the auxiliary heterojunction transistor and the additional auxiliary heterojunction transistor. It will be appreciated that more additional auxiliary heterojunction transistors can be added.

The active heterojunction transistor may be a high voltage transistor and the auxiliary heterojunction transistor may be a low voltage transistor compared to the active heterojunction transistor.

The heterojunction power device may further comprise a diode connected in parallel between the first and second additional terminals of the auxiliary heterojunction transistor. The parallel diode acts as a pull-down network during the turn-off of the overall configuration connecting to ground from the gate terminal of the active GaN transistor. When a positive bias (on-state) is applied to the auxiliary gate, the diode will be reverse-biased and zero current will flow through it, leaving unaffected the electrical behaviour of the overall high-voltage configuration. When a zero bias (off-state) will be applied to the auxiliary gate the diode will forward bias and the turn-off current flowing through it will discharge the gate capacitance of the active transistor, thus enabling the switching off of the overall configuration. In off-state, the gate of the active transistor will remain biased to a minimum voltage equal to the turn-on voltage of the diode. The diode will therefore be designed in such a way that its turn-on voltage will be as low as possible, ideally few mV. The diode may be formed monolithically with the device. The diode could be a simple Schottky diode. The diode generally pulls down the active gate during turn-off to the diode $V_{th}$, therefore the diode needs to be designed to have as low a threshold voltage as possible. A feature which can achieve this is the use of a recessed anode such that the contact is made directly to the 2DEG.

The heterojunction power device may further comprise a resistor connected in parallel between the first and second additional terminals of the auxiliary heterojunction transistor. The resistor is generally a relatively high value resistor connected in parallel between the first and second additional terminals of the low-voltage transistor (or the auxiliary transistor). The parallel resistor acts as a pull-down network during the turn-off of the overall configuration connecting to ground the gate terminal of the active GaN transistor. As a consequence, zero voltage will be applied to the gate of the active device when zero current is flowing into the resistor. The resistor will need to be chosen or designed as a relatively high value resistor. In this way, the resistor is less effective during on-state and turn-on as it is in parallel with the significantly smaller resistance of the auxiliary 2DEG. This resistor should generally be designed to play a role only during turn-off and off-state when the auxiliary transistor has a very large equivalent resistance. The resistor can be formed monolithically. For example this can be done by removing sections of the auxiliary gate/pGaN such that the 2DEG beneath those sections is always present and can act as a resistance which can pull down the active gate voltage during turn-off. The resistor could also be adjusted to be generally large during turn-on/on-state to see the benefits of the auxiliary gate on the device characteristics, nevertheless generally small, when compared to the equivalent resistance of the auxiliary transistor during turn-off to allow a fast turn-off. Generally speaking the relatively high value resistance could be at least about 500 ohm.

The heterojunction power device may further comprise a diode and a resistor each connected in parallel between the first and second additional terminals of the auxiliary heterojunction transistor. The diode is a low on-state voltage diode and the resistor is a high resistor connected in parallel between the drain and the source (gate) of the low-voltage transistor. The parallel connection of the diode and resistor will act as a pull-down network during the turn-off of the overall configuration. These components could be included in the design monolithically.

The first additional terminal (or the drain (gate) terminal) of the auxiliary heterojunction transistor may act as an external gate terminal and the second additional terminal (or the source terminal) of the auxiliary heterojunction transistor may be operatively connected to an anode of a low on-state voltage diode and a high voltage resistor in parallel, and wherein the second additional terminal (or the source terminal) of the auxiliary heterojunction transistor may act as a second external gate terminal.

The first additional terminal (or the drain (gate) terminal) and the second additional terminal (or the source terminal) of the auxiliary heterojunction transistor may each act as external gate terminals.

The auxiliary heterojunction transistor may be a first auxiliary heterojunction transistor, and the heterojunction device may further comprise a second auxiliary heterojunction transistor which may be operatively connected in parallel with the first auxiliary transistor, and the first additional terminal (or the drain (gate) terminal) of the first auxiliary heterojunction transistor may be connected to a source terminal of the second auxiliary heterojunction transistor, and the second additional terminal (or the source terminal) of the first auxiliary heterojunction transistor may be operatively connected to a drain (gate) terminal of the second auxiliary heterojunction transistor.

Two heterojunction power devices may be placed in a half bridge configuration, and the external gates of the two heterojunction power devices may be operatively connected to gate driving blocks which are in turn connected to logic blocks.

The heterojunction power device may be operatively connected in a full bridge configuration. The heterojunction power device may be operatively connected in a three-phase half bridge configuration.

The heterojunction power device may be operatively connected to gate driving circuitry.

It will be appreciated that, as already mentioned, the auxiliary heterojunction transistor may have the source and drain interchanged. Unlike in the active power transistor, the source and drain in the auxiliary heterojunction may be symmetrical or made and arranged in a similar way, so that the source can take the role of the drain and vice-versa.

According to a further aspect of the present disclosure, there is provided a method of manufacturing a III-nitride semiconductor based heterojunction device, the method comprising:

forming an active heterojunction power transistor on a substrate, the active heterojunction transistor comprising:
- a first III-nitride semiconductor region comprising a first heterojunction comprising an active two dimensional carrier gas;
- a first terminal operatively connected to the III-nitride semiconductor region;
- a second terminal laterally spaced from the first terminal and operatively connected to the III-nitride semiconductor region;
- an active gate region formed over the III-nitride semiconductor region, the active gate region being formed between the first terminal and the second terminal;

forming an auxiliary heterojunction transistor on said substrate or a further substrate, the auxiliary heterojunction transistor comprising:
- a second III-nitride semiconductor region comprising a second heterojunction comprising an auxiliary two dimensional carrier gas;
- a first additional terminal operatively connected to the second III-nitride semiconductor region;
- a second additional terminal laterally spaced from the first additional terminal and operatively connected to the second III-nitride semiconductor region;
- an auxiliary gate region formed over the second III-nitride semiconductor region, the auxiliary gate region being formed between the first additional terminal and the second additional terminal;

operatively connecting the first additional terminal with the auxiliary gate region, and operatively connecting the second additional terminal with the active gate region wherein the auxiliary heterojunction transistor results in an increase in a threshold voltage of said heterojunction power device and/or results in an increase in an operation voltage range of the first additional terminal.

The method may further comprise forming an isolator region between the active heterojunction transistor and auxiliary heterojunction transistor separating the active two dimensional carrier gas and the auxiliary two dimensional carrier gas.

The method may further comprise forming the first III-nitride semiconductor region at the same time as forming the second III-nitride semiconductor region.

The method may further comprise forming the active gate region at the same time as forming the auxiliary gate region.

The method may further comprise forming a metallization layer for the first terminal, the second terminal, the first additional terminal, and the second additional terminal at the same time.

BRIEF DESCRIPTION OF THE PREFERRED EMBODIMENTS

The present disclosure will be understood more fully from the detailed description that follows and from the accompanying drawings, which however, should not be taken to limit the disclosure to the specific embodiments shown, but are for explanation and understanding only.

Figure 23:
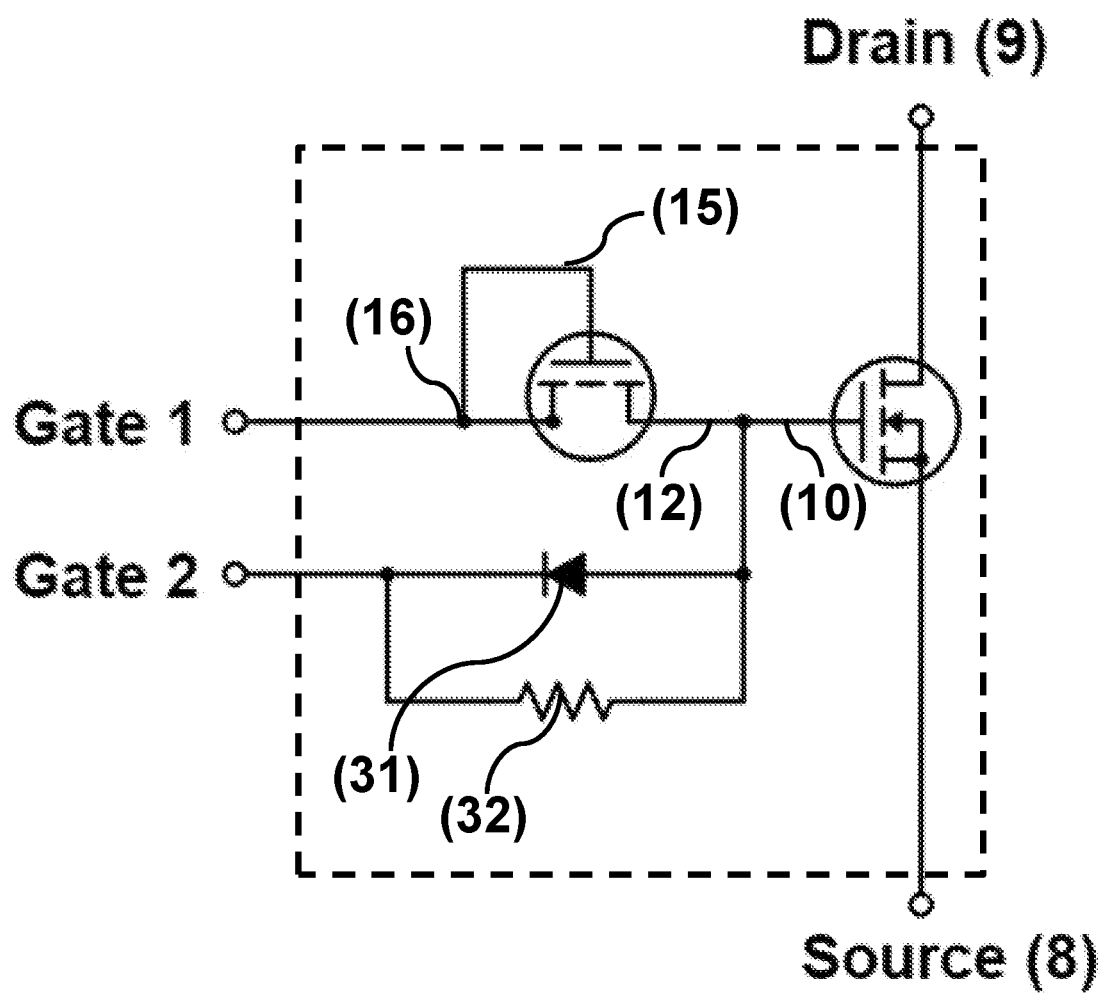
Figure 24:
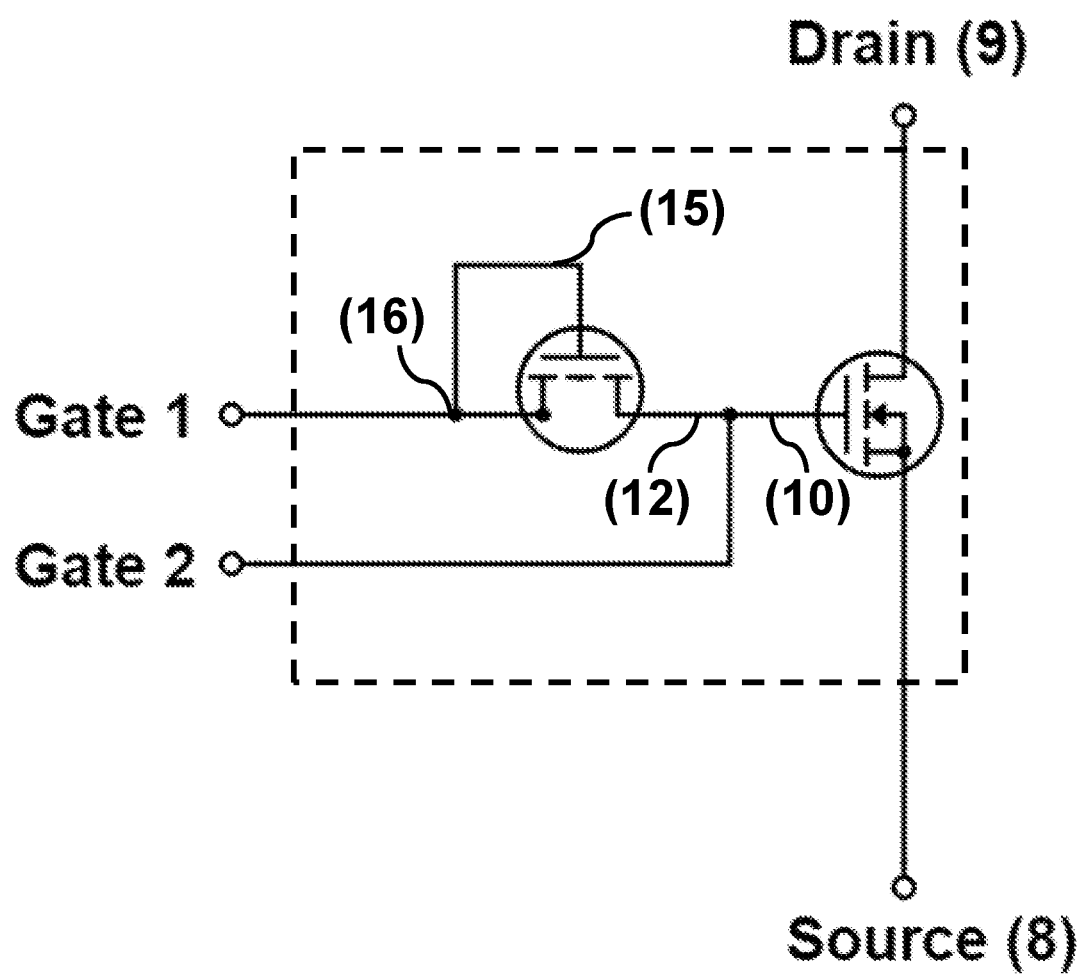
Figure 25:
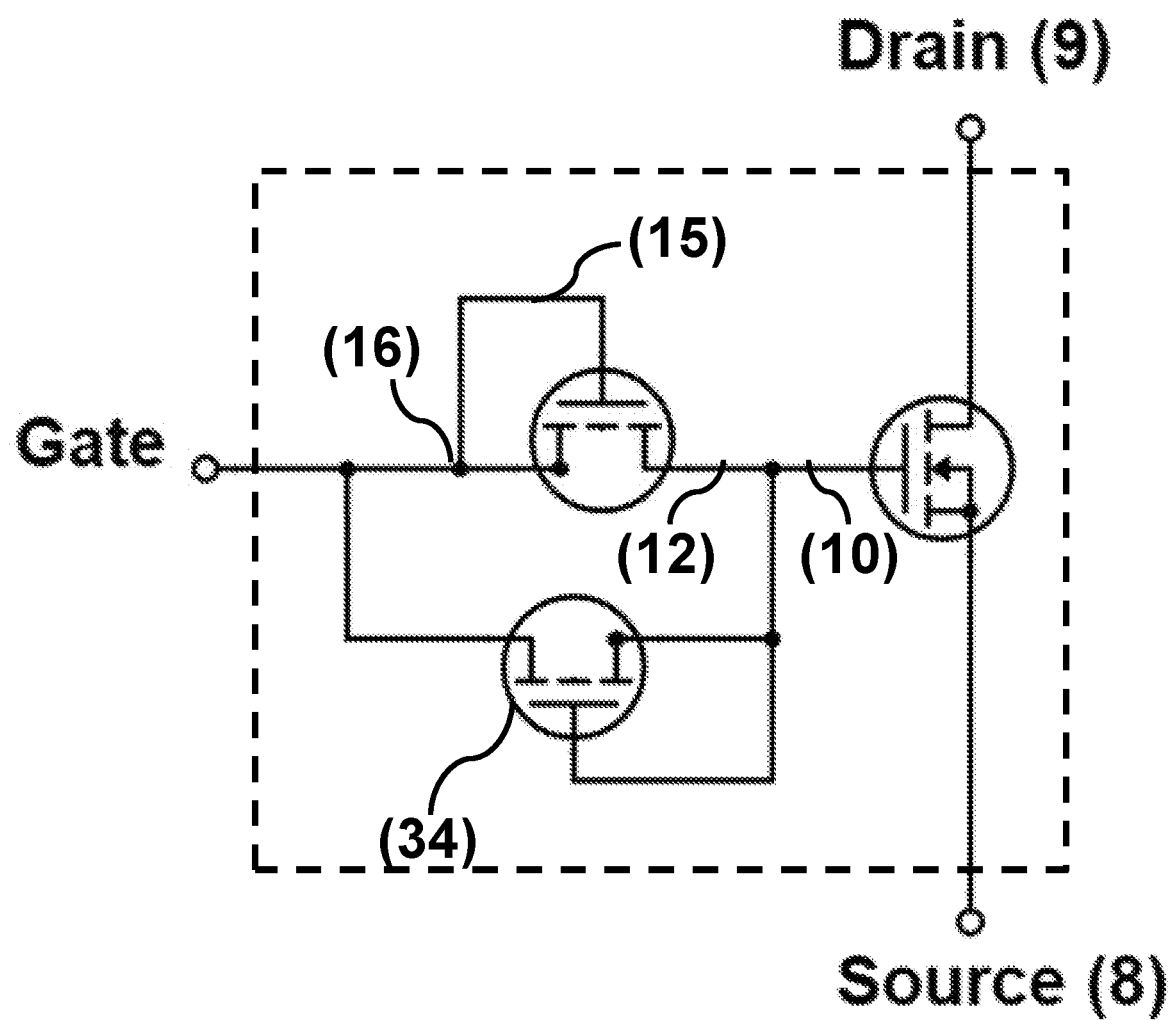
Figure 26:
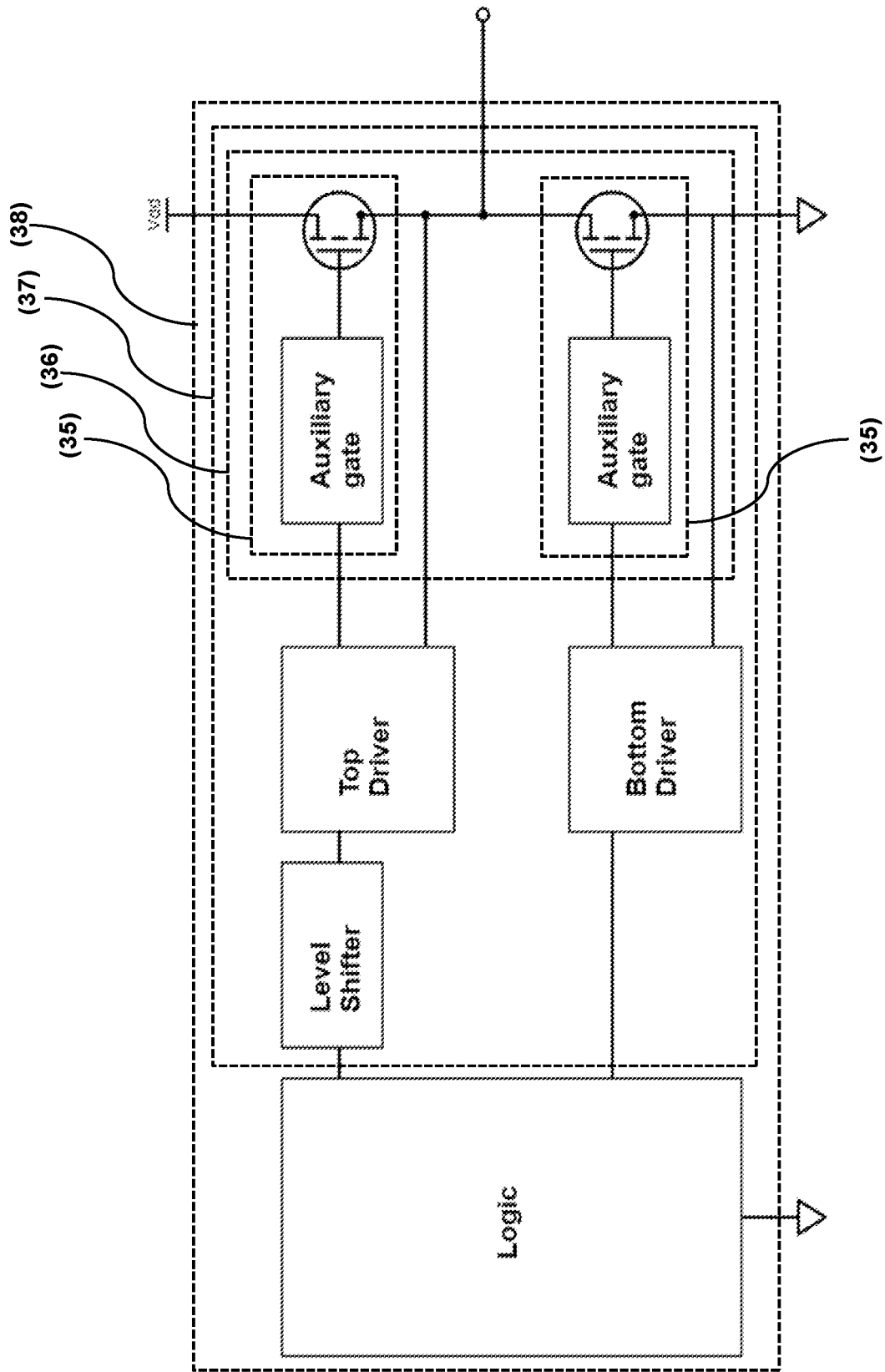
Figure 27:
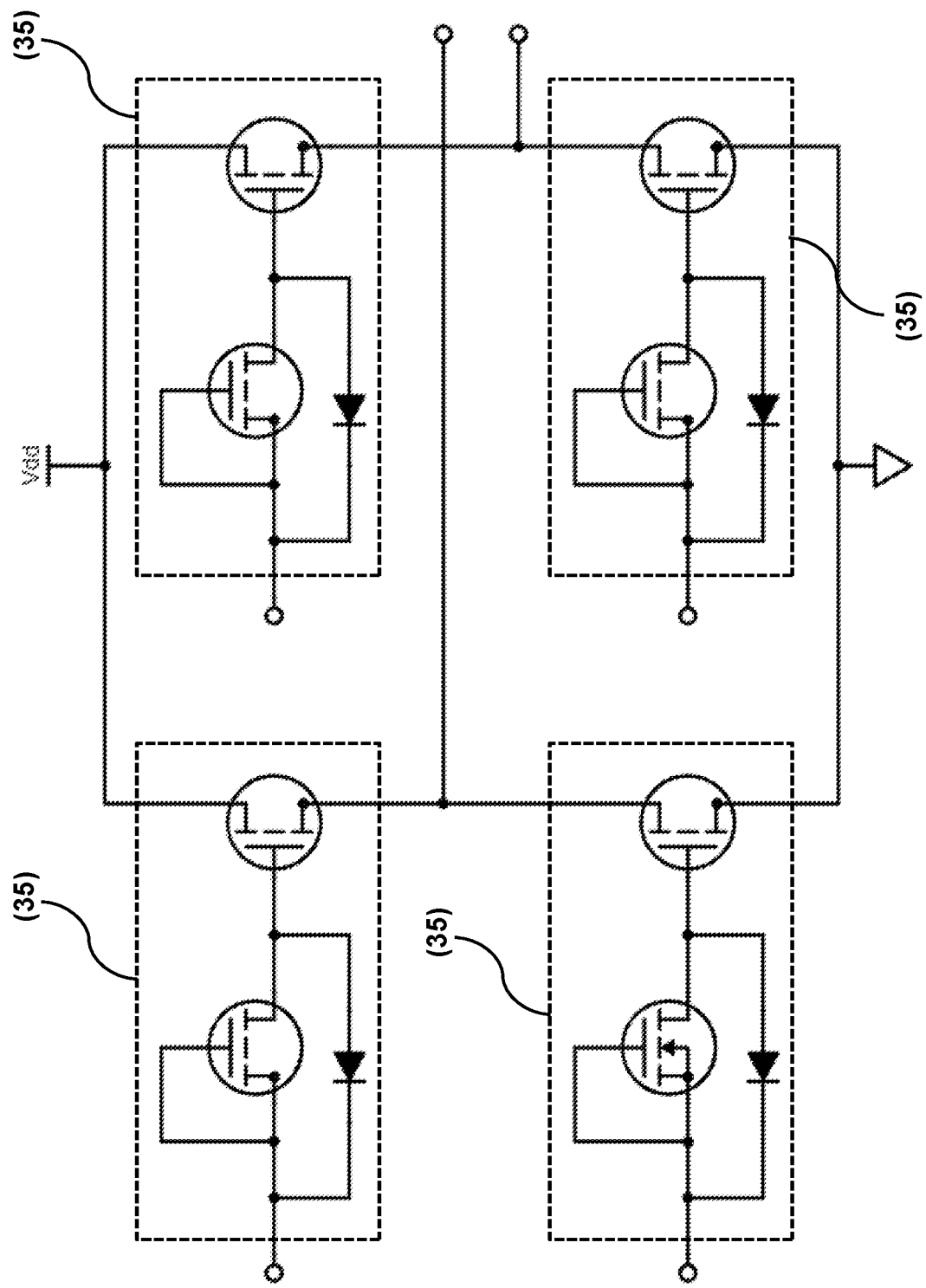
Figure 28:
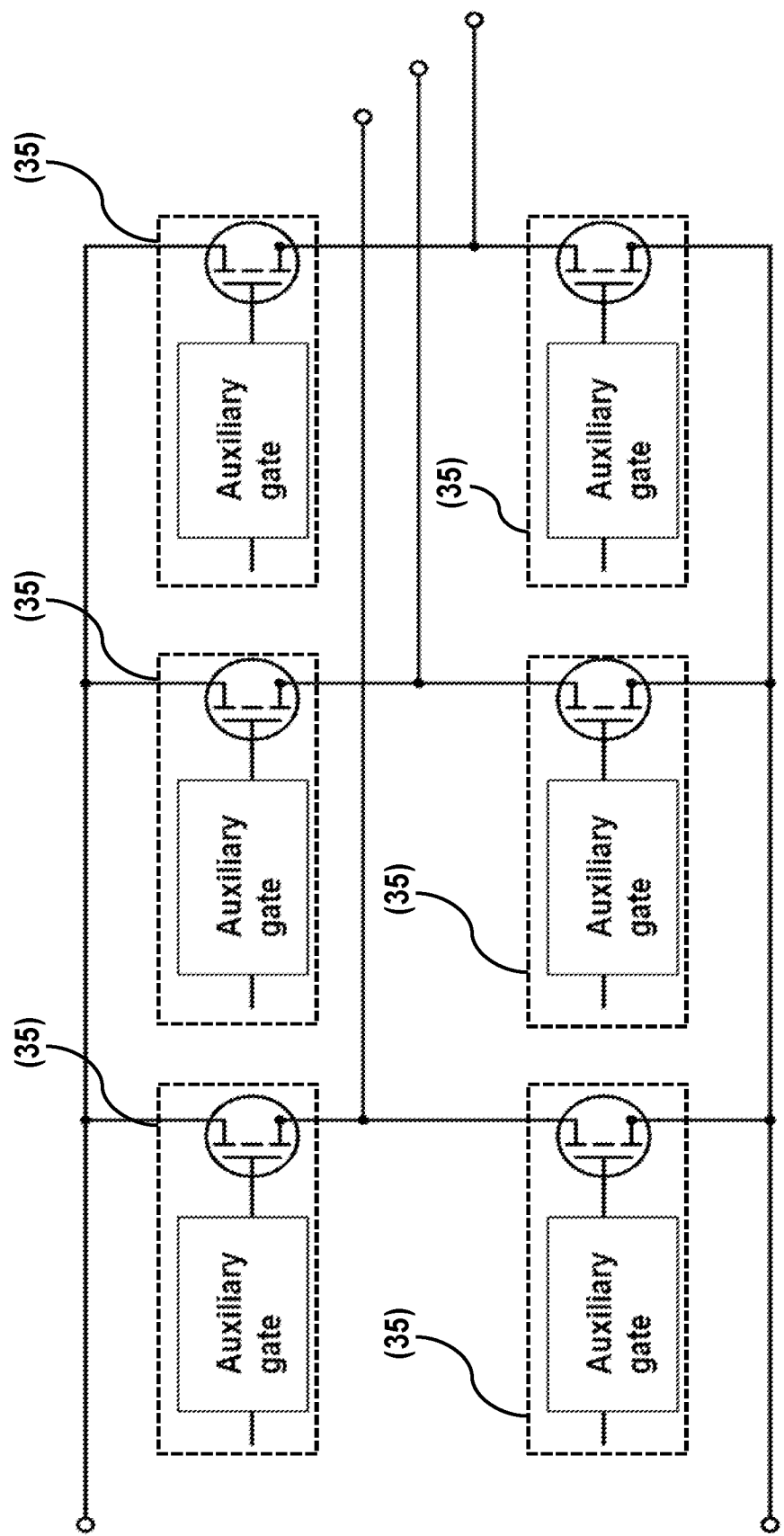
Figure 29:
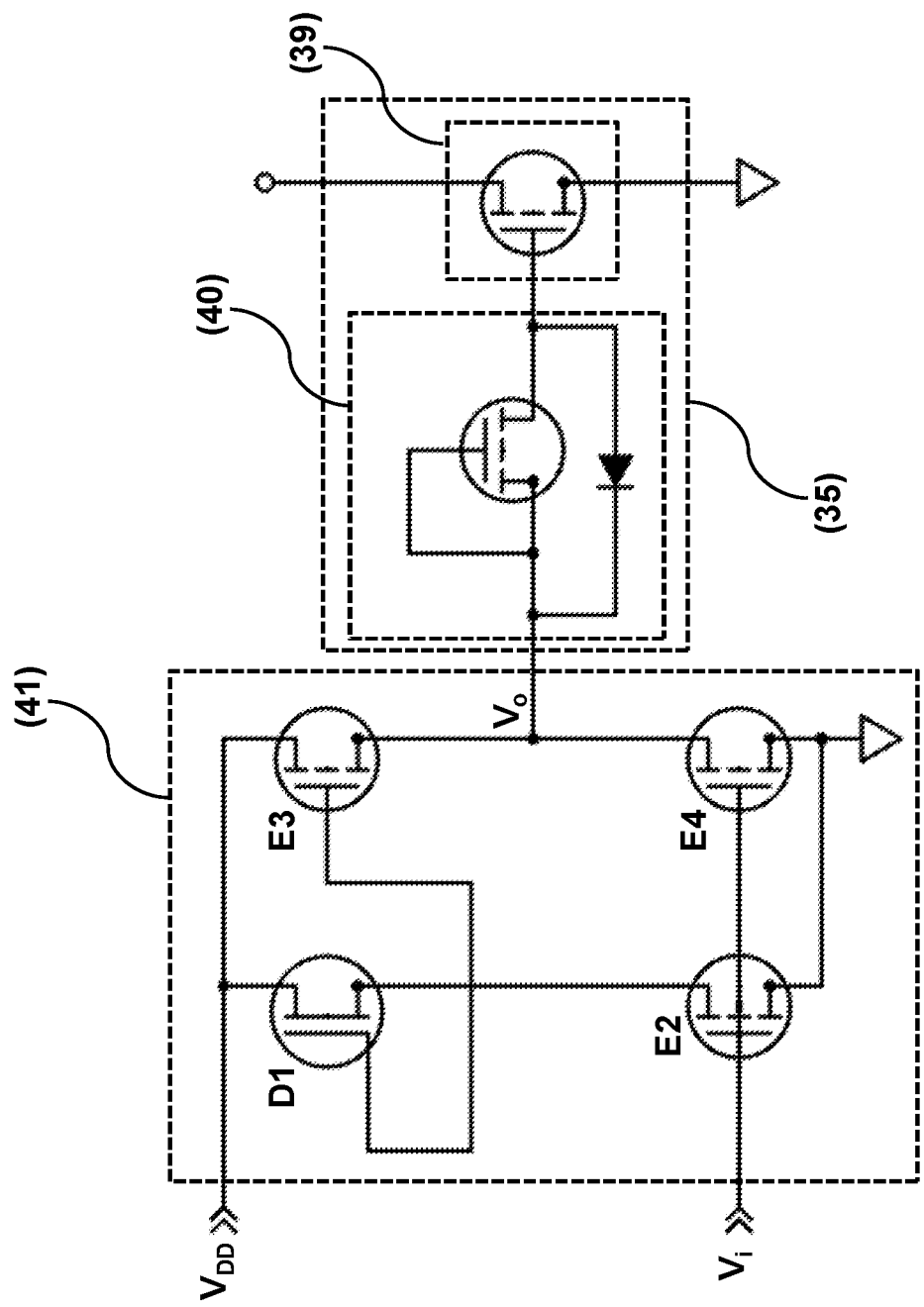

FIG. 23 shows a circuit schematic representation of a further embodiment of the proposed disclosure in which the drain (gate) terminal of the auxiliary transistor is available as an external gate terminal and the source terminal of the auxiliary transistor is connected to an anode of a low on-state voltage diode and a high voltage resistor in parallel and the cathode of the low on-state voltage diode is then available as a second external gate terminal;

FIG. 24 shows a circuit schematic representation of a further embodiment of the proposed disclosure in which the drain (gate) terminal and the source terminal of the auxiliary transistor are available as external gate terminals;

FIG. 25 shows a circuit schematic representation of a further embodiment of the proposed disclosure where a second auxiliary transistor is connected in parallel with a first auxiliary transistor where the drain (gate) terminal of the first low auxiliary transistor is connected to the source terminal of the second auxiliary transistor and the source terminal of the first auxiliary transistor is connected to the drain (gate) terminal of the second auxiliary transistor;

FIG. 26 shows a block diagram of a further embodiment of the proposed disclosure where any of the embodiments of the power device according to this disclosure are placed in a half bridge configuration, and the external gates of the two power devices (both high and low side) are connected to gate driving blocks which are in turn connected to logic blocks. The different components and blocks included in the figure can be discrete components or connected monolithically;

FIG. 27 shows a circuit schematic representation of a further embodiment of the proposed disclosure where the power device according to this disclosure is connected in a standard full bridge configuration;

FIG. 28 shows a circuit schematic representation of a further embodiment of the proposed disclosure where the power device according to this disclosure is connected in a standard three-phase half bridge configuration; and FIG. 29 shows a circuit schematic representation of a further embodiment of the proposed disclosure where the power device according to this disclosure is connected to standard gate driving circuitry.

DETAILED DESCRIPTION OF THE PREFERRED EMBODIMENTS

Figure 2:
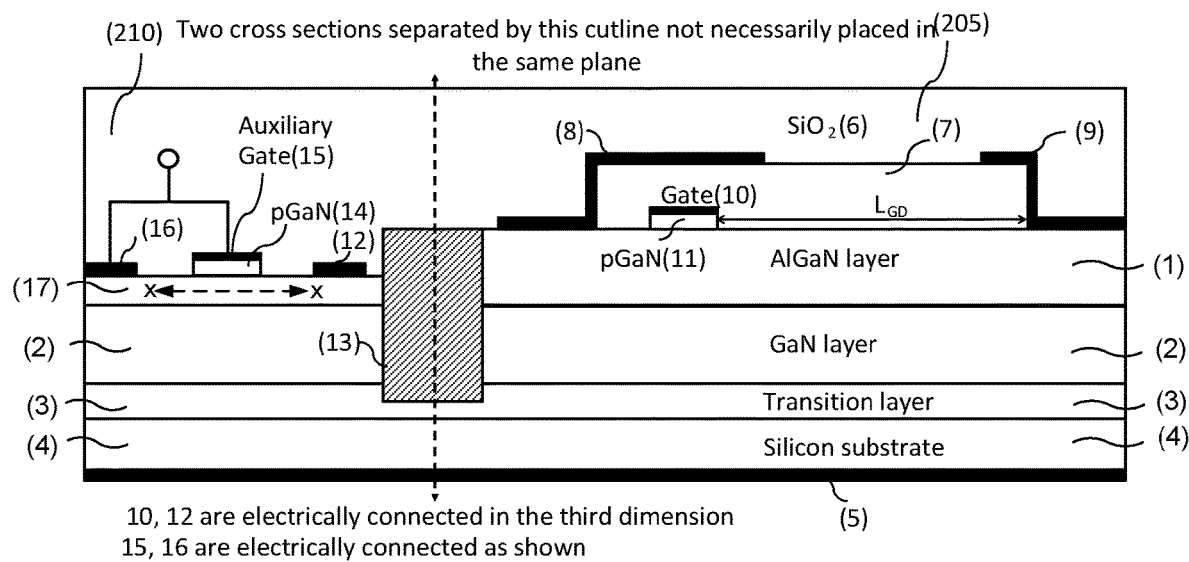
FIG. 2 illustrates a schematic representation of a cross section of the active area of the proposed disclosure according to one embodiment of the disclosure.

FIG. 2 illustrates a schematic representation of a cross section of the active area of the proposed disclosure, according to one embodiment of the disclosure. In use the current flows in the active area of the semiconductor device. In this embodiment, the device comprises a semiconductor (e.g. silicon) substrate 4 defining a major (horizontal) surface at the bottom of the device. Below the substrate 4 there is a substrate terminal 5. The device includes a first region of a transition layer 3 on top of the semiconductor substrate 4. The transition layer 3 comprises a combination of III-V semiconductor materials acting as an intermediate step to allow the subsequent growth of regions of high quality III-V semiconductor materials.

On top of the transition layer 3 there exists a second region 2. This second region 2 is of high quality III-V semiconductor (for example GaN) and comprises several layers. A third region 1 of III-V semiconductor containing a mole fraction of Aluminium is formed on top of the second region 2. The third region 1 is formed such that a heterostructure is formed at the interface between the second 2 and third region 1 resulting in the formation of a two dimensional electron gas (2DEG).

A fourth region of highly p-doped III-V semiconductor 11 is formed in contact with the third region 1. This has the function of reducing the 2DEG carrier concentration when the device is unbiased, and is pGaN material in this embodiment. A gate control terminal 10 is configured over the fourth region 11 in order to control the carrier density of the 2DEG at the interface of the second 2 and third region 1. A high voltage drain terminal 9 is arranged in physical contact with the third region 1. The high voltage drain terminal forms an ohmic contact to the 2DEG. A low voltage source terminal 8 is also arranged in physical contact with the third region 1 and also forms an ohmic contact to the 2DEG.

A portion of surface passivation dielectric 7 is formed on top of the fourth region 1 and between the drain terminal 9 and source terminal 8. A layer of $SiO_2$ passivation 6 is formed above the surface passivation dielectric 7 and source and drain terminals 8, 9.

The device is separated into two cross sections by a vertical cutline. The two cross sections may not be necessarily placed in the same plane. The features described above are on one side (right hand side, for example) of the vertical cutline. This is termed as the active device 205. The other side of the vertical cutline (the left hand side, for example) is termed as the auxiliary device 210, which also comprises a semiconductor substrate 4, a transition layer 3, a second region 2 and a $SiO_2$ passivation region 6.

A fifth region of III-V semiconductor 17 containing a mole fraction of Aluminium is positioned above the second region 2 in the auxiliary device such that a hetero-structure is formed at the interface between this fifth region 17 and the second region 2. This results in the formation of a second two dimensional electron gas (2DEG) in a region which will be referred to as the auxiliary gate. This AlGaN layer 17 of the auxiliary device 210 can be identical or different to the AlGaN layer 1 in the active device 205. The AlGaN layer thickness and Al mole fraction are critical parameters as they affect the carrier density of electrons in the 2DEG [15].

A sixth region of highly p-doped III-V semiconductor 14 is formed on top of and in contact with the fifth region 17. This has the function of reducing the 2DEG carrier concentration when the auxiliary gate is unbiased. An auxiliary gate control terminal 15 is configured over the sixth region 14 in order to control the carrier density of the 2DEG at the interface of the fifth 17 and second region 2. The auxiliary gate pGaN layer 14 may be identical or different to the active gate pGaN layer 11. Critical parameters which could differ include, but are not limited to, pGaN doping and width along the x-axis (shown in the figure).

An isolation region 13 is formed down the vertical cutline. This cuts the electrical connection between the 2DEG formed in the active device 205 and the 2DEG formed in the auxiliary device 210.

A first additional terminal 16 is arranged on top of and in physical contact with the fifth region 17 of the auxiliary device 210. This forms an ohmic contact to the 2DEG of the auxiliary device 210 and is also electrically connected (via interconnection metal) to the auxiliary gate control terminal 15 configured over the sixth region (pGaN) 14. The first additional terminal 16 is biased at the same potential as the auxiliary gate terminal 15 of the auxiliary device. A second additional terminal 12 is also arranged on top of and in physical contact with the fifth region 17 of the auxiliary device 210. This forms an ohmic contact to the 2DEG of the auxiliary device 210 and is electrically connected (via interconnection metal) to the active gate control terminal 10 configured over the fourth region 11 of the active device 205. The interconnection between the second additional terminal 12 of the auxiliary device 210 and the active gate terminal 10 of the active device 205 can be made in the third dimension and can use different metal layers in the process. Note that this interconnection is not shown in the schematic in FIG. 2. A similar but not necessarily identical AlGaN/GaN structure is used in the auxiliary gate.

When the device is in use the auxiliary gate 14, 15 drives the active gate 10, 11. The auxiliary 2DEG layer formed between the first and second additional terminals 12, 16 with the portion under the auxiliary p-GaN gate 14 is controlled by the potential applied to the auxiliary gate terminal 15.

The portion of the auxiliary 2DEG under the auxiliary pGaN gate 14 is depleted when the auxiliary gate terminal 15 and the short-circuited first additional terminal 16 are at 0V. As the auxiliary gate bias is increased (both terminals 15, 16) the 2DEG starts forming under the pGaN gate 14 connecting to the already formed 2DEG layer which connects to the first and second additional terminals 16, 12. A 2DEG connection is now in place between the first and second additional terminals 12, 16.

As the second additional terminal 12 is connected to the active gate 10 the device can now turn on. A positive (and desirable) shift in the device threshold voltage is observed using this structure as not all of the potential applied to the auxiliary gate 15 is transferred to the active gate 10. Part of this potential is used to form the auxiliary 2DEG under the auxiliary gate 15 and only part is transferred to the second additional terminal 12 which is connected to the active gate 10.

The auxiliary gate provides the additional advantage of being able to control the gate resistance of the device more easily. This can be achieved by varying the field plate design or distance between terminals 12 and 15 or 15 and 16. This can be useful in controlling the unwanted oscillations observed due to the fast switching of these devices.

Different embodiments of the device can include terminals 10, 15 being either Schottky or Ohmic contacts or any combination of those two.

Figure 3:
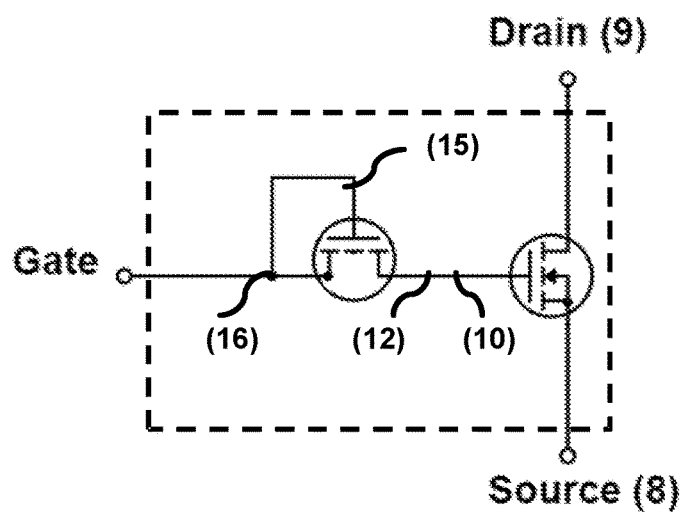
FIG. 3 shows a circuit schematic representation of one embodiment of the proposed disclosure as shown in the schematic cross section of FIG. 2.

FIG. 3 shows a circuit schematic representation of one embodiment of the proposed disclosure as shown in the schematic cross section of FIG. 2. The features shown in FIG. 3 carry the same reference numbers as the features in FIG. 2.

Figure 4:
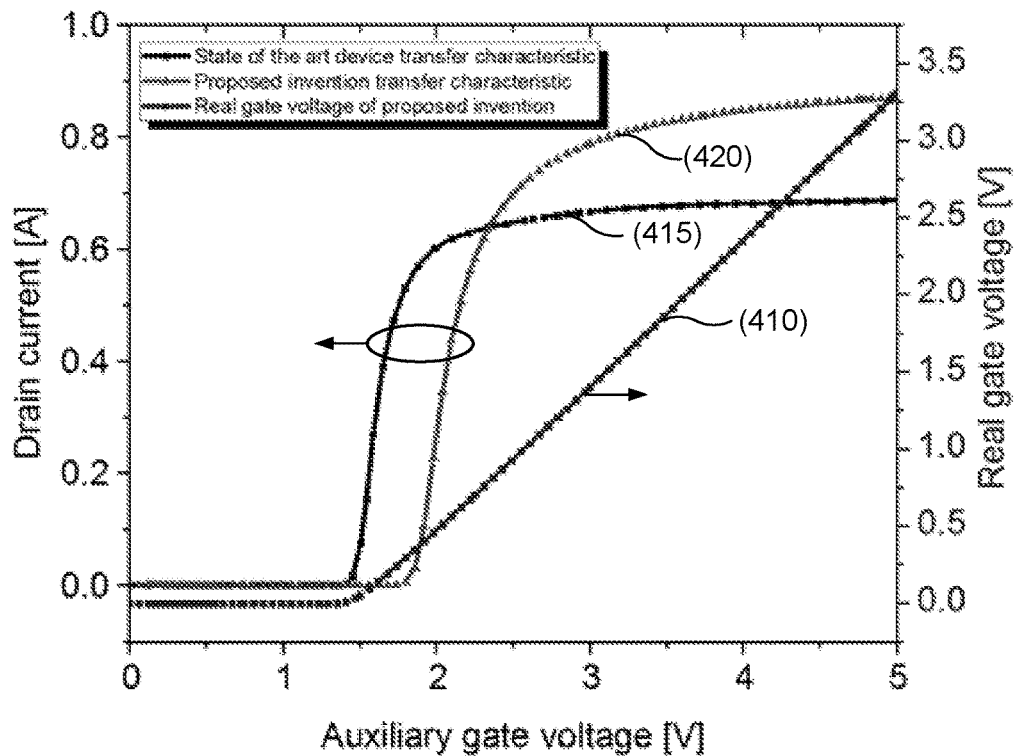
FIG. 4 shows the relationship between the auxiliary gate voltage bias and the active gate voltage as well as a comparison of the transfer characteristics of the state of art device and the proposed disclosure in FIGS. 2 and 3.

FIG. 4 shows the relationship 410 between the auxiliary gate voltage bias and the active gate voltage as well as a comparison of the transfer characteristics of the state of art device 415 and the proposed disclosure 420 in FIGS. 2 and 3. The threshold voltage increase can be achieved without any compromise in the on-state resistance of the device. The use of the auxiliary gate to control the threshold voltage therefore also allows increasing the density of carriers in the 2DEG in the real device and thus reducing the device on-state resistance as seen in the comparison of the transfer characteristics of the state of art device 415 and the proposed disclosure 420. Since terminal 12 is connected to the active gate 10 (not shown) the device can turn on. A positive (and desirable) shift (see graph 420) in the device threshold voltage is observed using this structure as not all of the potential applied to the auxiliary gate is transferred to the active gate (part of this potential is used to form the auxiliary 2DEG under the auxiliary gate) and only part is transferred to the terminal 12 which is connected to the active gate 10.

Figure 5:
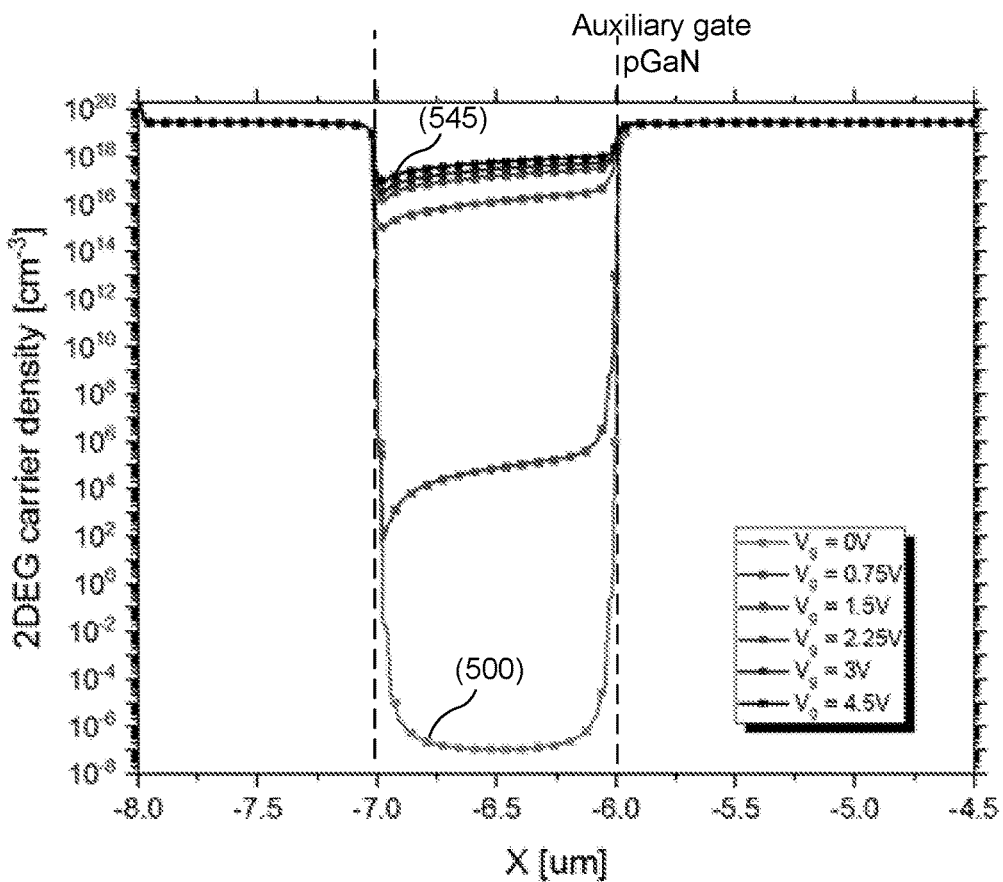
FIG. 5 shows the carrier density in the 2DEG below the auxiliary gate along the X-axis as the auxiliary gate is biased between 0V and 4.5V in the proposed disclosure shown in FIGS. 2 and 3.

FIG. 5 shows the carrier density in the 2DEG below the auxiliary gate along the X-axis (shown in FIG. 2) as the auxiliary gate is biased between 0V (500) and 4.5V (545) in the proposed disclosure shown in FIGS. 2 and 3.

Figure 6:
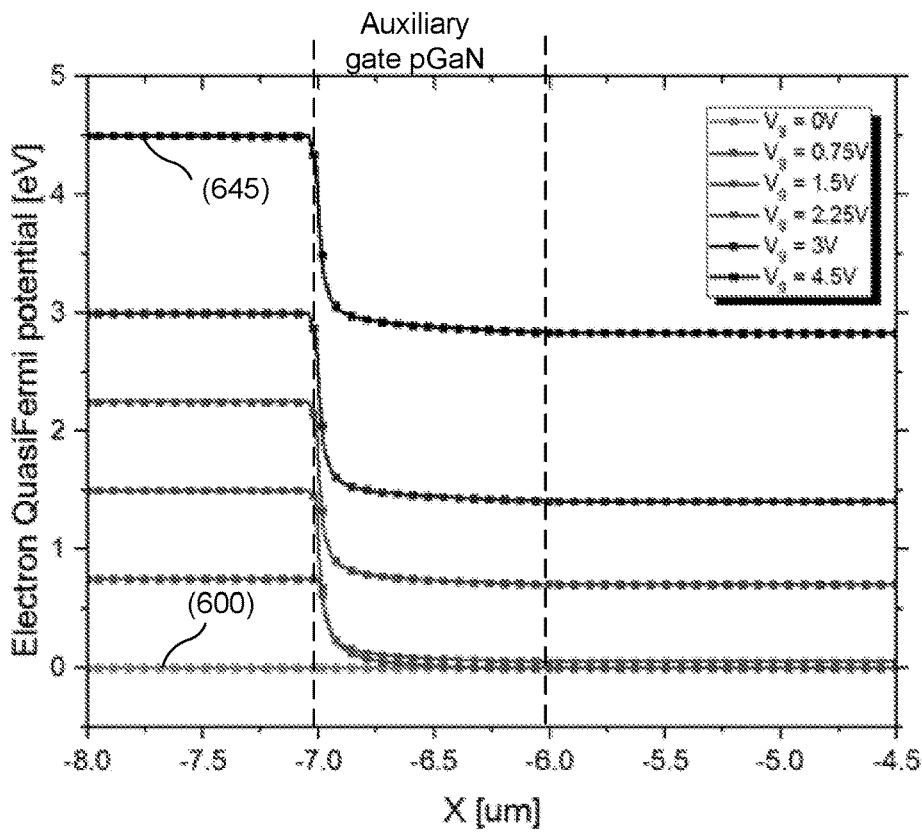
FIG. 6 shows the electron Quasi-Fermi potential below the auxiliary gate along the X-axis as the auxiliary gate is biased in the proposed disclosure shown in FIGS. 2 and 3.

FIG. 6 shows the electron Quasi-Fermi potential below the auxiliary gate along the X-axis (shown in FIG. 2) as the auxiliary gate is biased. These simulations show that the majority of the potential drop occurs at the edge of the auxiliary gate closer to the first additional terminal 16, for auxiliary gate bias between 0V (600) and 4.5V (645).

Figure 7:
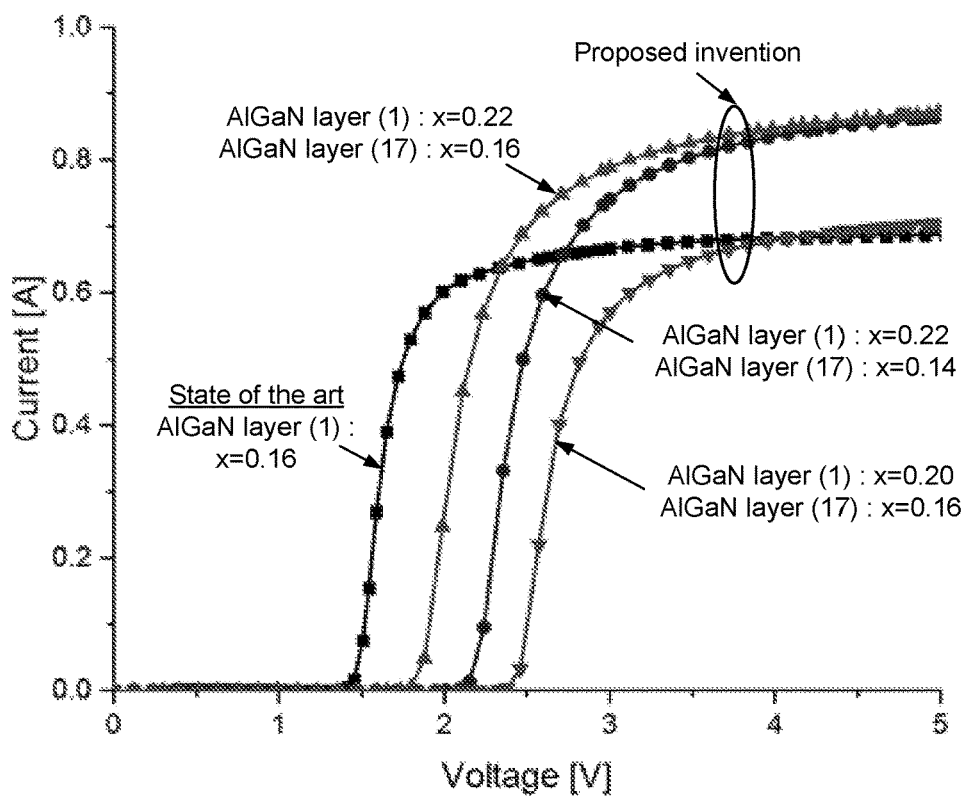
FIG. 7 shows the transfer characteristic of state of the art device and variations of the proposed disclosure to illustrate that the device threshold and on-state resistance can be easily controlled by adjusting the thickness or aluminium mole fraction of the AlGaN layer in both the real device and the auxiliary gate.

FIG. 7 shows the transfer characteristic of state of the art device and variations of the proposed disclosure to illustrate that the device threshold and on-state resistance can be easily controlled by adjusting the thickness or aluminium mole fraction of the AlGaN layer 1, 17 in both the active device and the auxiliary gate device, respectively.

Figure 8:
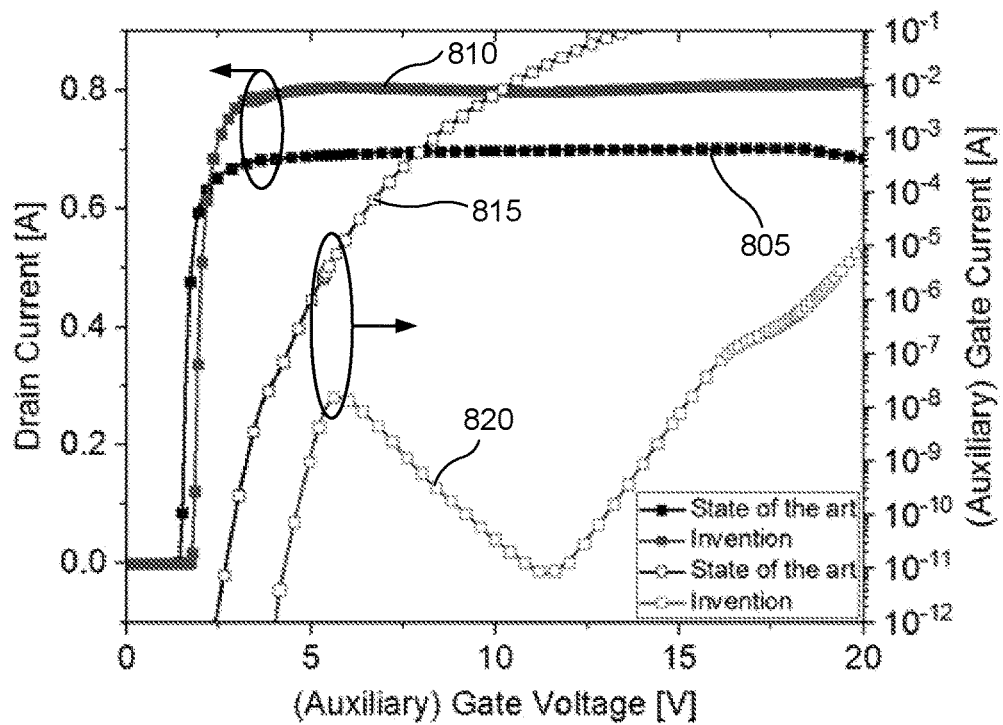
FIG. 8 shows the transfer characteristic and gate turn-on of state of the art device and the proposed disclosure.

FIG. 8 shows the transfer characteristic and gate turn-on of state of the art device and the proposed disclosure. This shows that the device gate turn-on will also be extended as some of the gate potential 820 is dropped in the auxiliary gate 2DEG compared with the state of the art 815. The device gate turn-on will be extended by more than the threshold providing a larger window of operation. The drain current for the state of the art 805 is also compared to the drain current of the proposed disclosure 810.

Figure 9:
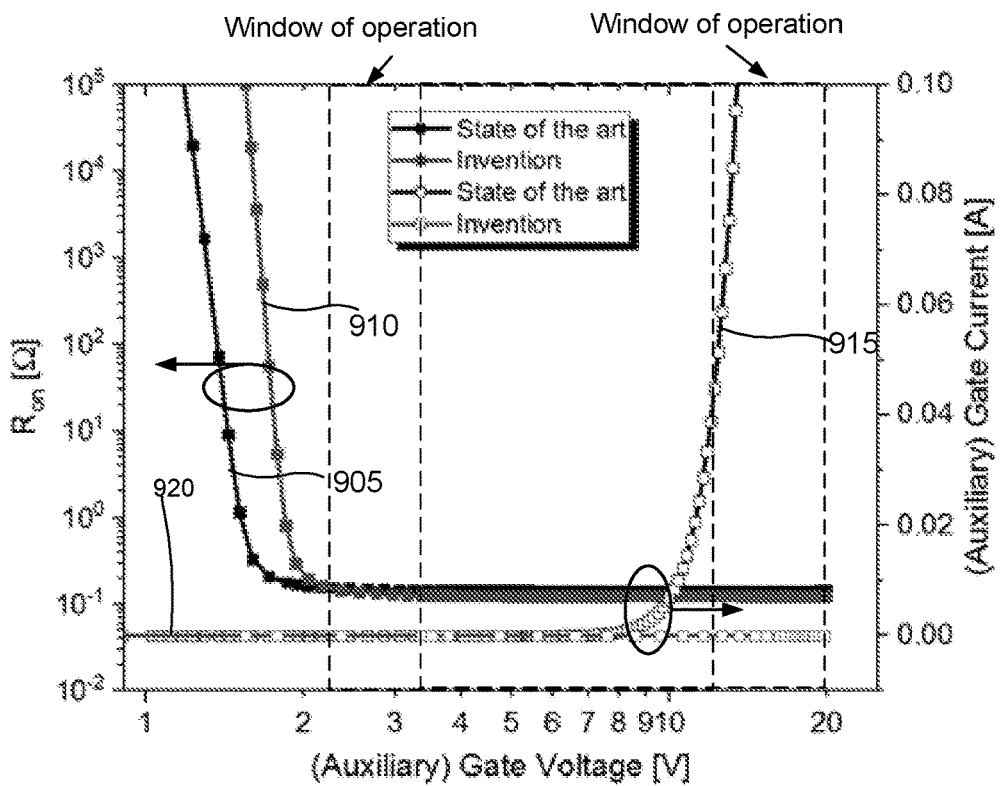
FIG. 9 shows the on-state resistance for the proposed disclosure and the state of the art as well as the auxiliary gate current for the proposed disclosure and the state of the art.

FIG. 9 shows the on-state resistance for the proposed disclosure 910 and the state of the art 905 as well as the auxiliary gate current for the proposed disclosure 920 and the state of the art 915. The proposed disclosure can lead to a device with increased threshold, reduced on-state resistance and improved switching capability. The wider gate bias window of operation can also be seen.

It is apparent from the results from FIG. 4 to FIG. 9 that the auxiliary gate 15 provides the additional advantage of being able to control the gate resistance of the active device 205 more easily. This can be achieved by varying a field plate design or distance between terminals (12) & (15) or (15) & (16). This is useful in controlling the unwanted oscillations observed due to the fast switching of these devices. Techniques for adjusting the gate resistance using the auxiliary structure will be described in following embodiments.

Advantageously, the proposed design can lead to a device with increased threshold, reduced on-state resistance and improved switching capability. The wider gate bias window of operation is seen in FIG. 9.

Figure 10:
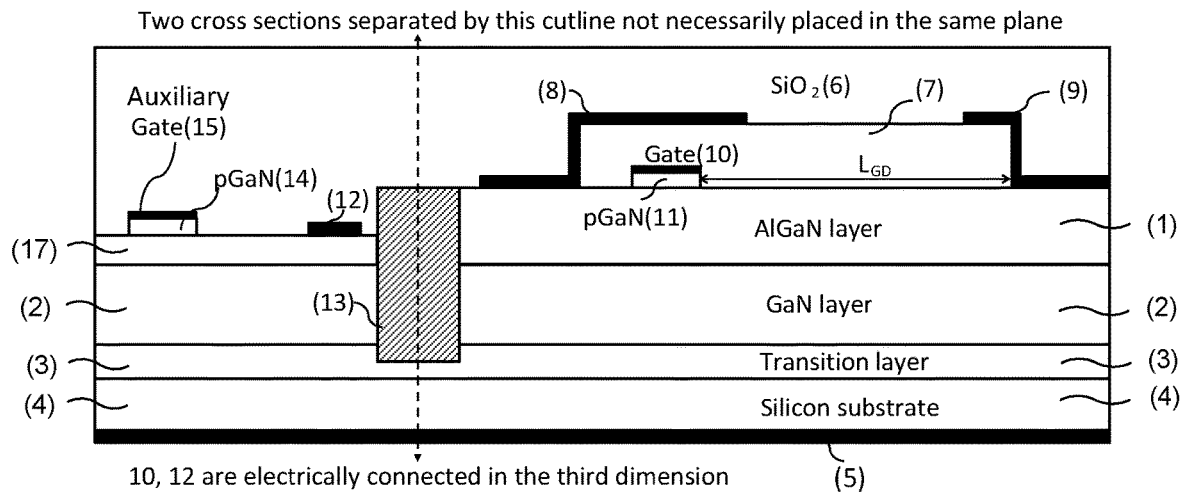
FIG. 10 illustrates a schematic representation of a cross section of the active area of a semiconductor device in which the first additional terminal is not present and the gate driving current is provided solely by the auxiliary gate terminal.

FIG. 10 illustrates a schematic representation of a cross section of the active area of a semiconductor device in which the first additional terminal 16 is not present and the gate driving current is provided solely by the auxiliary gate terminal 15. Many features of this device are similar to those in the FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, SiO$_2$ passivation layer 6, isolation region 13, auxiliary AlGaN layer 17, auxiliary pGaN layer 14, auxiliary gate terminal 15 and additional terminal 12. In this device the first additional terminal is not present and the gate driving current is provided solely by the auxiliary gate terminal 15. The doping in the auxiliary pGaN layer 14 may be significantly lower than the doping in the active pGaN layer 11.

Figure 11:
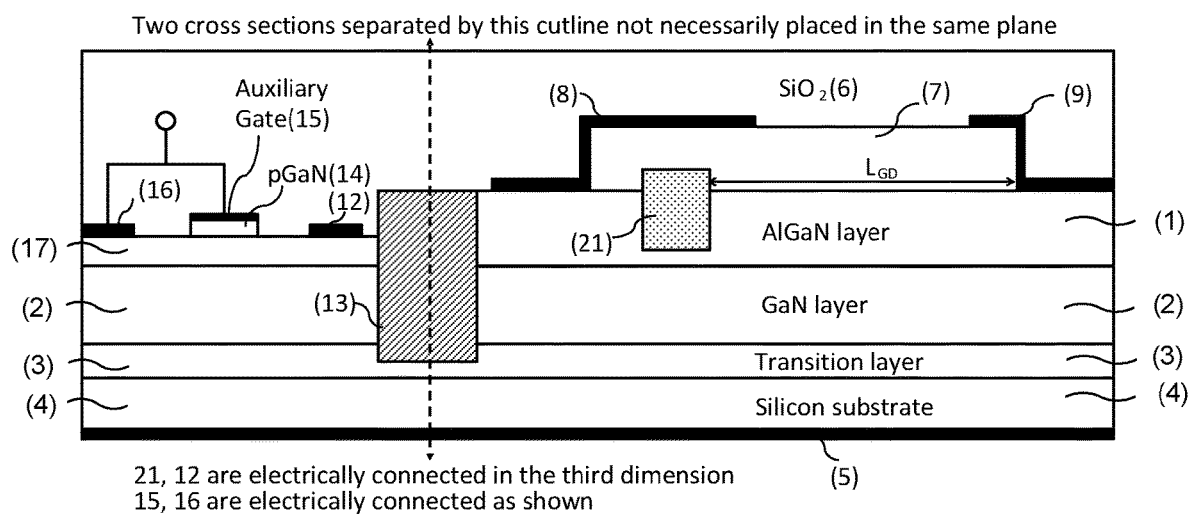
FIG. 11 illustrates a schematic representation of a cross section of the active area of a further embodiment of the disclosure in which the active gate is replaced by a recessed Schottky gate contact.

FIG. 11 illustrates a schematic representation of a cross section of the active area of a further embodiment of the disclosure in which the active gate is replaced by a recessed Schottky gate contact 21. Many features of this embodiment are similar to those shown in FIG. 2 and therefore carry the same reference numerals, i.e., the semiconductor substrate 4, substrate terminal 5, transition layer 3, GaN layer 2, AlGaN layer 1, surface passivation dielectric 7, low voltage source terminal 8, high voltage drain terminal 9, SiO$_2$ passivation layer 6, isolation region 13, auxiliary AlGaN layer 17, auxiliary pGaN layer 14, auxiliary gate terminal 15, first additional terminal 16 and second additional terminal 12. However in this embodiment the pGaN gate in the active device is replaced by a recessed Schottky gate contact 21. The recessed Schottky gate 21 is another way of achieving a normally-off AlGaN/GaN HEMT [6]. This embodiment would again lead to a device with a desirable and adjustable shift in the threshold voltage and gate turn-on voltage.

Figure 12:
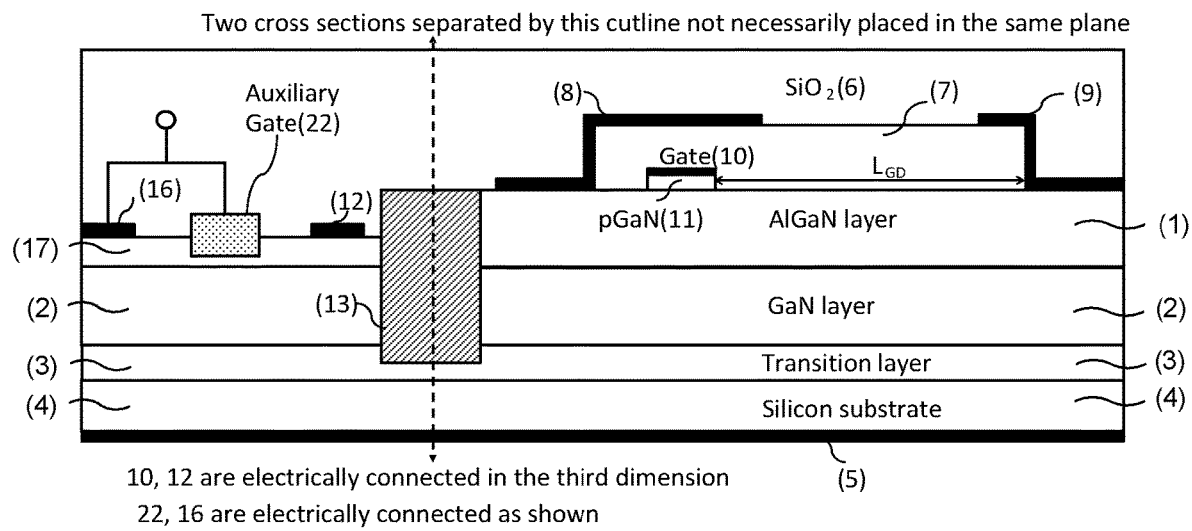
FIG. 12 illustrates a schematic representation of a cross section of the active area of a further embodiment of the disclosure in which the auxiliary gate is replaced by a recessed Schottky gate contact.

FIG. 12 illustrates a schematic representation of a cross section of the active area of a further embodiment of the disclosure in which the auxiliary gate is replaced by a recessed Schottky gate contact. Many features of this embodiment are similar to those shown in FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, SiO$_2$ passivation layer 6, isolation region 13, auxiliary AlGaN layer 17, first additional terminal 16 and second additional terminal 12. However, in this embodiment the pGaN gate in the auxiliary device is replaced by a recessed Schottky gate contact 22.

Figure 13:
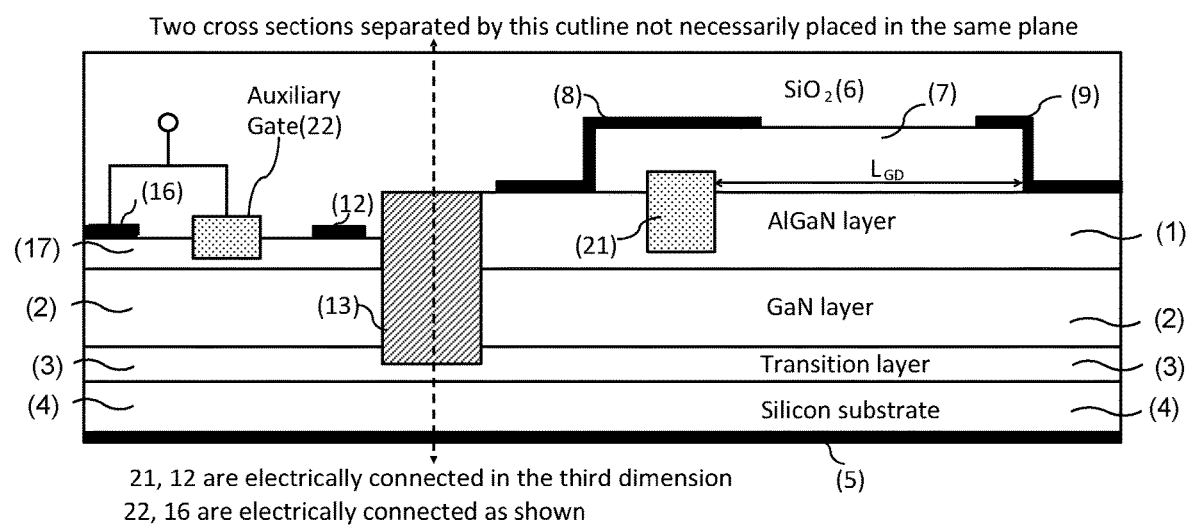
FIG. 13 illustrates a schematic representation of a cross section of the active area of a further embodiment of the disclosure in which both the active gate and auxiliary gate are replaced by recessed Schottky gate contacts.

FIG. 13 illustrates a schematic representation of a cross section of the active area of a further embodiment of the disclosure in which both the active gate and auxiliary gate are replaced by Schottky gate contacts. Many features of this embodiment are similar to those shown in FIG. 2 and therefore carry the same reference numerals, i.e., the semiconductor substrate 4, substrate terminal 5, transition layer 3, GaN layer 2, AlGaN layer 1, surface passivation dielectric 7, low voltage source terminal 8, high voltage drain terminal 9, SiO$_2$ passivation layer 6, isolation region 13, auxiliary AlGaN layer 17, first additional terminal 16 and second additional terminal 12. However, this embodiment is a combination of the two previous embodiments in that both the pGaN gate in the active device and the auxiliary device are replaced by recessed Schottky contacts 21, 22 respectively.

Figure 14:
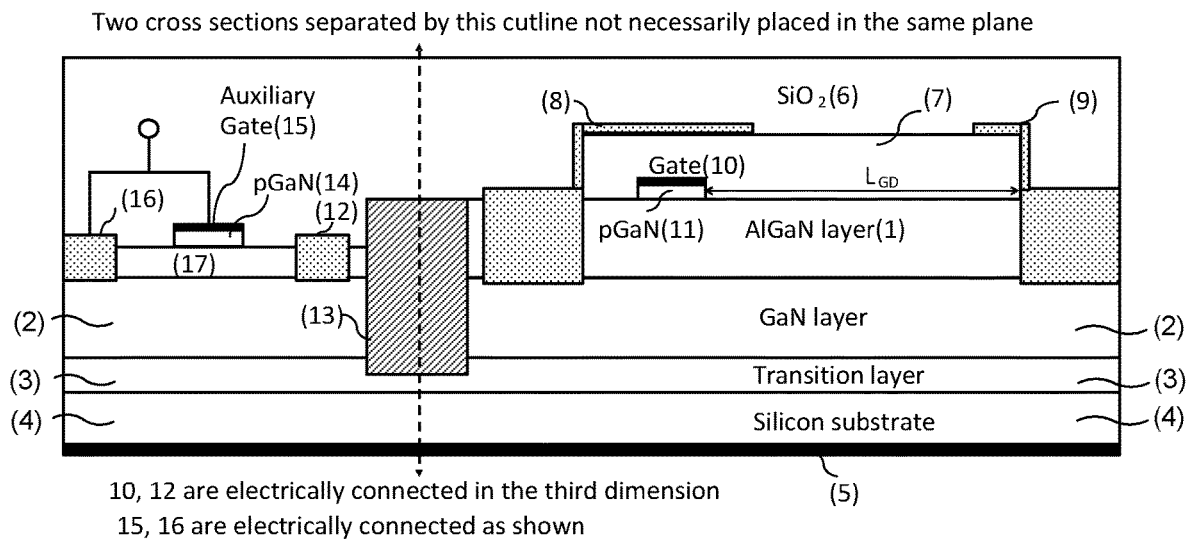
FIG. 14 illustrates a schematic representation of a cross section of the active area of a further embodiment of the disclosure in which all the ohmic contacts to the 2DEG are replaced with recessed contacts instead of surface contacts.

FIG. 14 illustrates a schematic representation of a cross section of the active area of a further embodiment of the disclosure in which all the ohmic contacts to the 2DEG are replaced with recessed contacts instead of surface contacts. Many features of this embodiment are similar to those shown in FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, SiO$_2$ passivation layer 6, isolation region 13, auxiliary AlGaN layer 17, auxiliary pGaN layer 14, and auxiliary gate terminal 15. However, in this embodiment, any or all of the ohmic contacts to the 2DEG can be recessed contacts 8, 9, 12, 16 instead of surface contacts.

Figure 1:
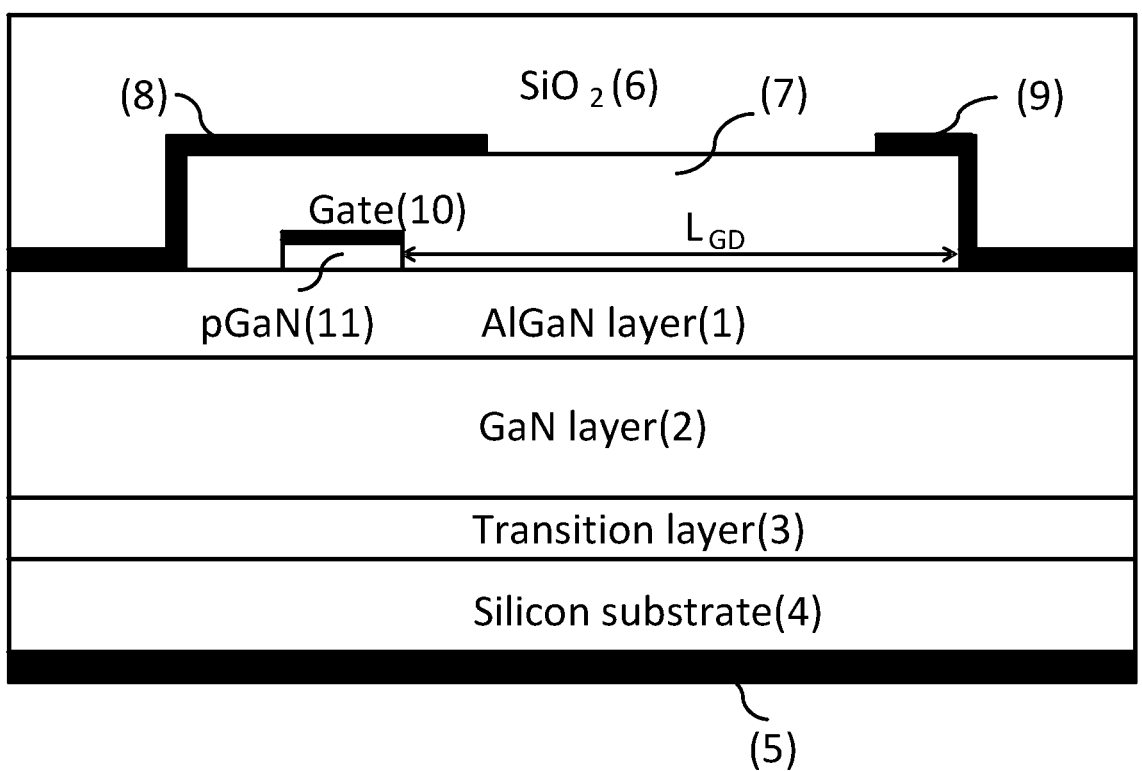
FIG. 1 shows schematically the cross section in the active area of a state of the art pGaN HEMT.
Figure 15:
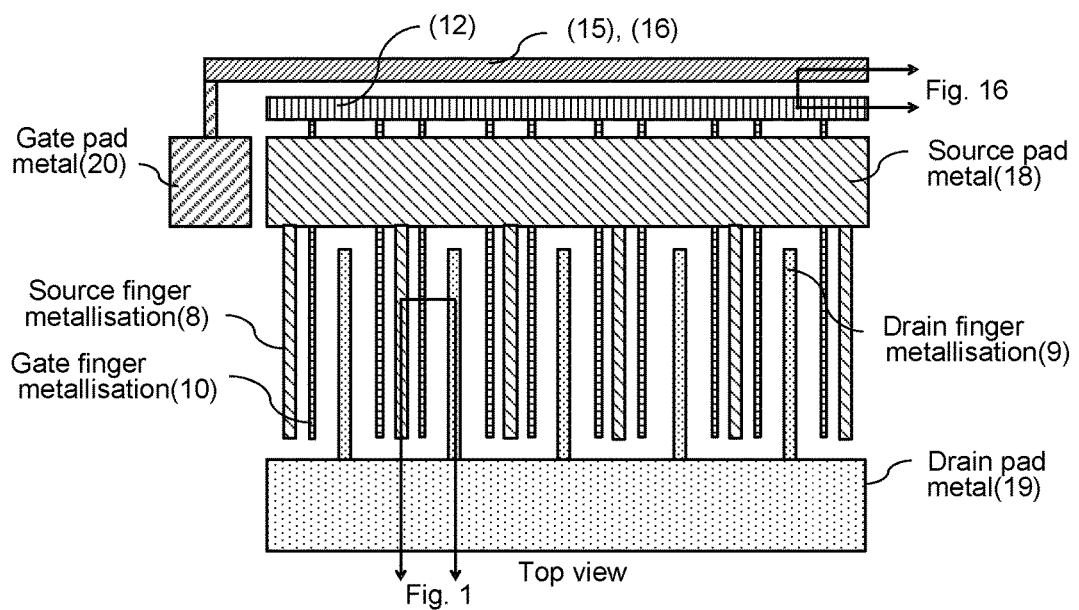
FIG. 15 illustrates an interdigitated device layout of a further embodiment of the disclosure incorporating an auxiliary gate structure.
Figure 16:
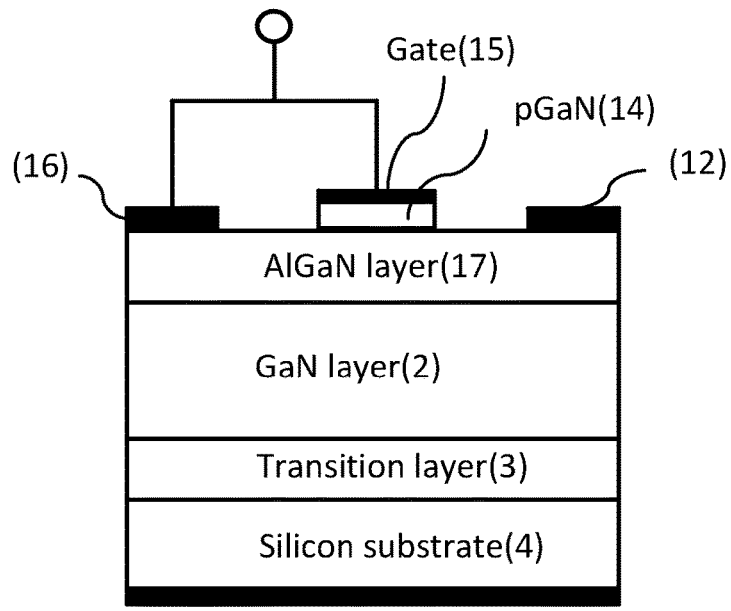
FIG. 16 shows the cross section of the auxiliary gate structure as used in the interdigitated layout of FIG. 15.

FIG. 15 illustrates an interdigitated device layout of a further embodiment of the disclosure incorporating an auxiliary gate structure. Many features of this embodiment are similar to those shown in FIG. 2 and therefore carry the same reference numerals, i.e., active gate terminal 10, low voltage source terminal 8, high voltage drain terminal 9, auxiliary gate terminal 15, first additional terminal 16 and second additional terminal 12. Also shown in this illustration are the source pad metal 18, drain pad metal 19, and gate pad metal 20. However, in this embodiment rather than the gate pad metal 20 being contacted to the gate fingers 10 directly as in a state of the art device it is connected to the auxiliary gate terminals 15, 16. The gate fingers in the interdigitated structure are directly connected to the second additional terminal 12. For a better understanding of the layout the cross sections at different areas of the device are shown in FIG. 1 and FIG. 16. Note that in this layout, as in the cross sections in previous embodiments, an isolation layer exists between the 2DEG in the auxiliary gate and the active device.

Figure 17A:
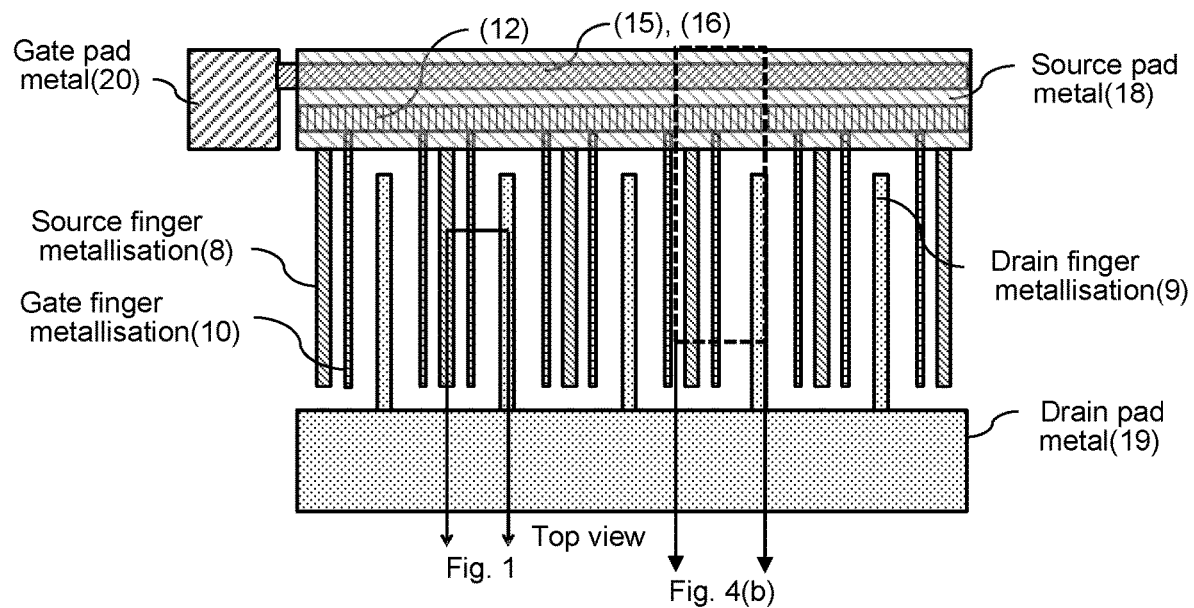
FIG. 17(a) illustrates an interdigitated device layout of a further embodiment of the disclosure in which the auxiliary gate and terminal regions are placed below the source pad metal.
Figure 17B:
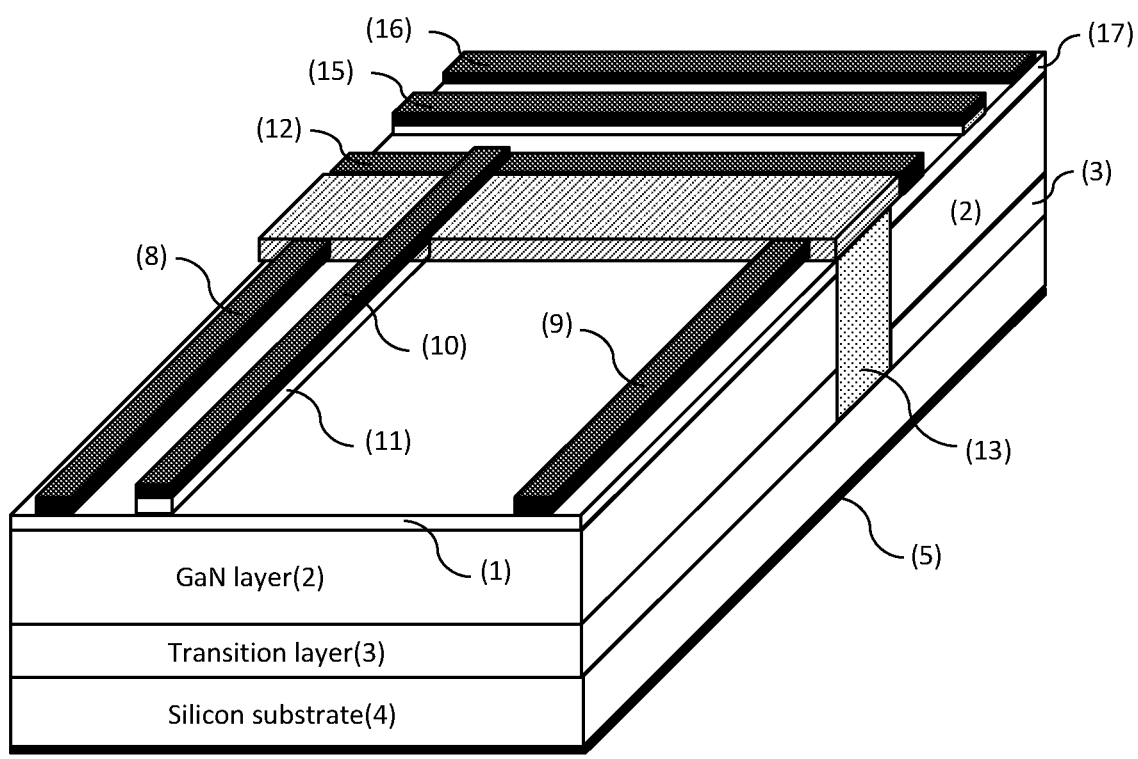
FIG. 17(b) illustrates 3D schematic representation of the embodiment of FIG. 17(a)

FIG. 17(a) illustrates an interdigitated device layout of a further embodiment of the disclosure in which the auxiliary gate and terminal regions are placed below the source pad metal. Many features of this embodiment are similar to those shown in FIG. 15 and therefore carry the same reference numerals, i.e., active gate terminal 10, low voltage source terminal 8, high voltage drain terminal 9, auxiliary gate terminal 15, first additional terminal 16, second additional terminal 12, source pad metal 18, drain pad metal 19, and gate pad metal 20. However, in this embodiment, the auxiliary gate 15, 16 and terminal regions are placed below the source pad metal 18. No additional wafer area would be needed to include the auxiliary gate structure compared to a state of the art design. FIG. 17(b) uses a 3D illustration to show a possible connection of active gate 10 and second additional terminal 12. In this embodiment the active and auxiliary gate cross sections are not in the same plane as in FIG. 2. Note that FIG. 17(b) only shows the surface metallisation layers. Nonetheless, multiple metallisation layers would normally be used in the layout of such a device.

Figure 18:
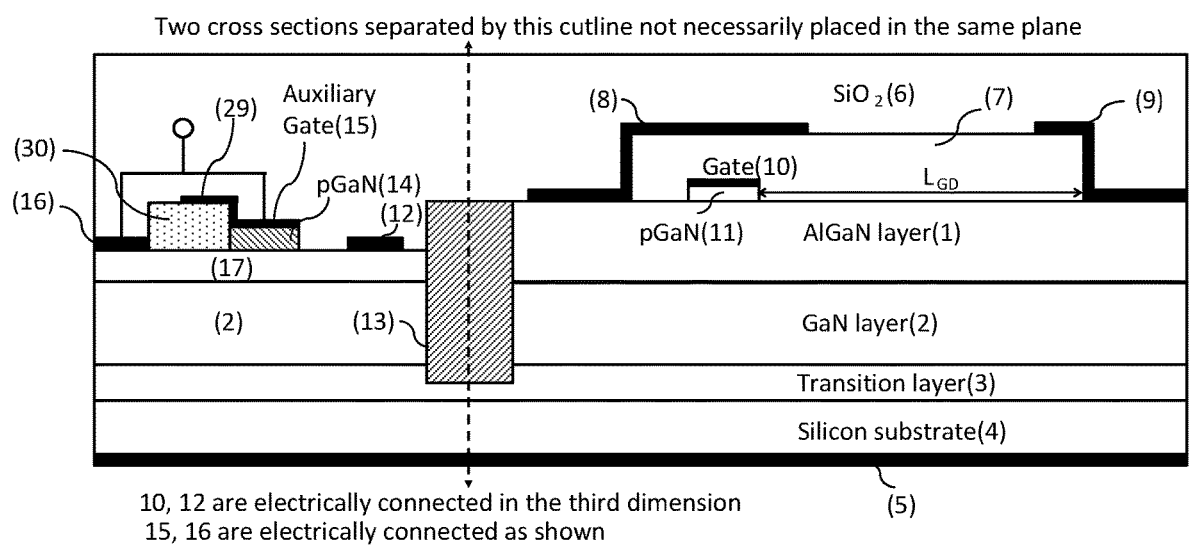
FIG. 18 illustrates a schematic representation of a cross section of the active area of a further embodiment of the disclosure in which a field plate design is included at the auxiliary gate terminal edge closer to the first additional terminal.

FIG. 18 illustrates a schematic representation of a cross section of the active area of a further embodiment of the disclosure in which a field plate design is included at the auxiliary gate terminal edge closer to the first additional terminal. Many features of this embodiment are similar to those of FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, SiO$_2$ passivation layer 6, isolation region 13, auxiliary AlGaN layer 17, auxiliary pGaN layer 14, auxiliary gate 15, first additional terminal 16 and second additional terminal 12. However, in this embodiment, a field plate design 29 is included at the auxiliary gate terminal edge closer to the first additional terminal 16, incorporating a passivation layer 30. The design of this field plate 29 is useful due to the majority of the potential drop (as the auxiliary gate 15 is biased) occurring at the 2DEG vertically beneath this point.

Figure 19:
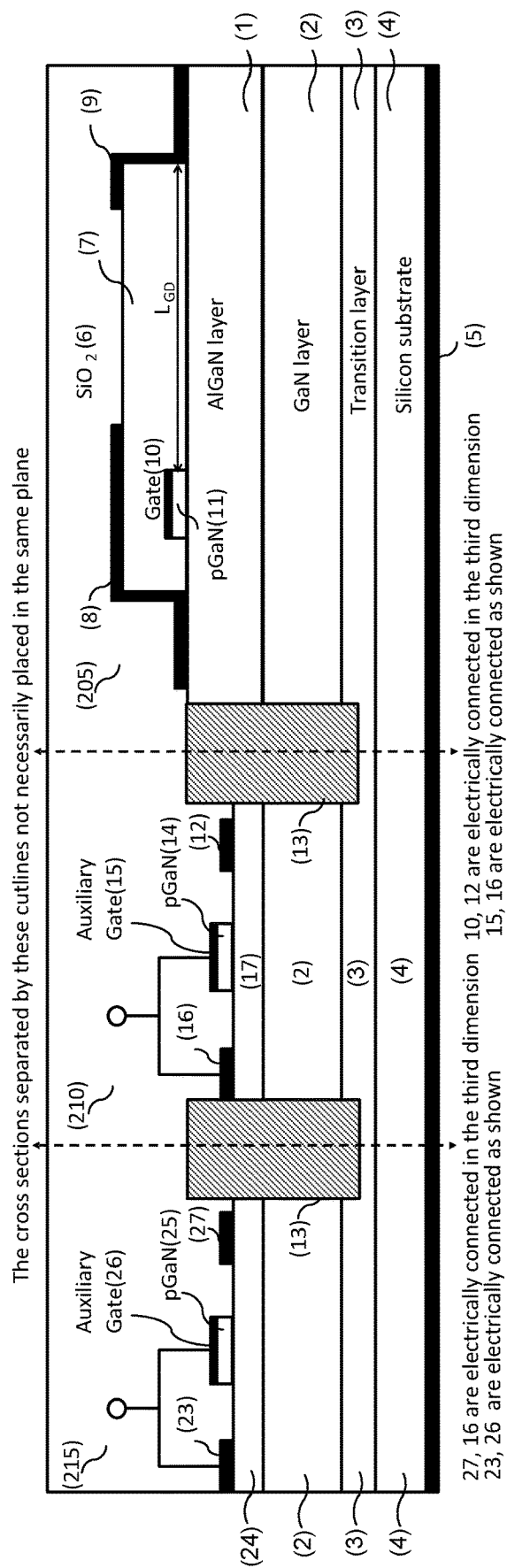
FIG. 19 illustrates a schematic representation of a cross section of the active area of a further embodiment of the disclosure in which a second auxiliary gate is included.

FIG. 19 illustrates a schematic representation of a cross section of the active area of a further embodiment of the disclosure in which a second auxiliary gate is included. Many of the features of this embodiment are similar to those of FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, SiO$_2$ passivation layer 6, isolation region 13, auxiliary AlGaN layer 17, auxiliary pGaN layer 14, auxiliary gate 15, first additional terminal 16 and second additional terminal 12. However, in this embodiment, a secondary auxiliary gate 26 is included in a second auxiliary device 215. The secondary auxiliary region has the same structure as that shown in previous embodiments in that it comprises a semiconductor substrate 4, a substrate terminal 5, a transition layer 3, a GaN layer 4, a secondary auxiliary AlGaN layer 24, a secondary auxiliary pGan layer 25, a secondary auxiliary gate terminal 26, a secondary first additional terminal 23, a secondary second additional terminal 27 and an additional isolation region 13. The first and secondary auxiliary gate regions 15, 26 are separated by a vertical cutline similar to the cutline separating the active gate region and the first auxiliary gate region. The cross sections separated by cut-lines are not necessarily in the same plane. The secondary first additional terminal 23 is electrically connected to the secondary auxiliary gate 26. The secondary second additional terminal 27 is electrically connected to the auxiliary first additional terminal 16. More auxiliary gate-transistors can be integrated to increase the value of the threshold voltage of the high-voltage GaN device.

Figure 20A:
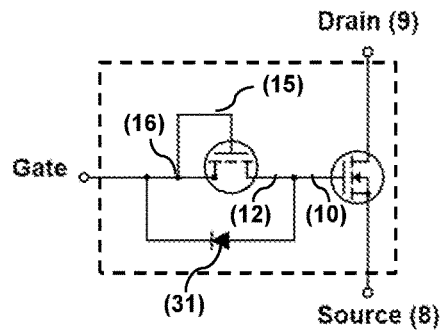
FIG. 20(a) shows a circuit schematic representation of a further embodiment of the proposed disclosure in which a low on-state voltage diode is connected in parallel between the drain and the source of the auxiliary transistor.
Figure 20B:
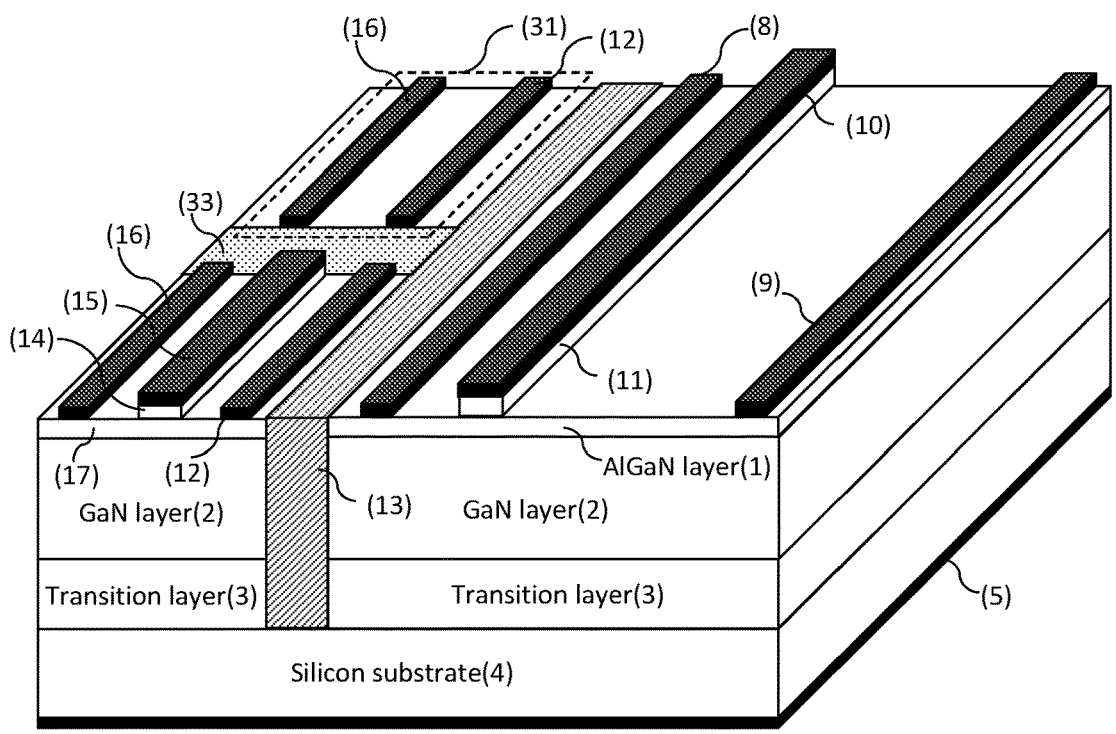
FIG. 20(b) illustrates a 3D schematic representation of the embodiment of FIG. 20(a)
Figure 20C:
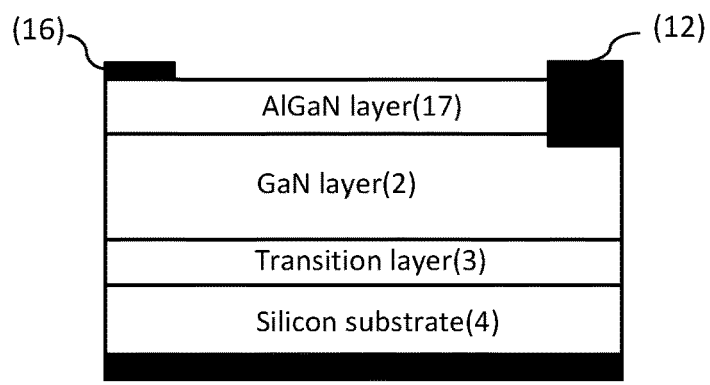
FIG. 20(c) shows the cross section of the low voltage diode as used in embodiment of FIG. 20(a)

FIG. 20(a) shows a circuit schematic representation of a further embodiment of the proposed disclosure in which a low on-state voltage diode is connected in parallel between the drain and the source of the auxiliary transistor, as shown in the schematic 3D illustration in FIG. 20(b). Many of the features of this embodiment are similar to those of FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, SiO$_2$ passivation layer 6, isolation region 13, auxiliary AlGaN layer 17, auxiliary pGaN layer 14, auxiliary gate 15, first additional terminal 16 and second additional terminal 12. However, in this embodiment a low on-state voltage diode 31 is connected in parallel between the drain 16 and the source 12 of the auxiliary transistor. The parallel diode 31 acts as pull-down network during the turn-off of the overall configuration connecting to ground the gate terminal 10 of the active GaN transistor. When a positive bias (known as on-state) is applied to the auxiliary gate 15, the diode 31 will be reverse-biased and zero current will flow through it, leaving unaffected the electrical behaviour of the overall high-voltage configuration. When a zero bias (off-state) will be applied to the auxiliary gate 15 the diode 31 will be forward bias and the turn-off current flowing through it will discharge the gate capacitance of the active transistor, thus enabling the switching off of the overall configuration. In off-state, the gate of the active device 10 will remain biased to a minimum voltage equal to the turn-on voltage of the diode. The diode 31 will therefore be designed in such a way that its turn-on voltage will be as low as possible, ideally few mV. FIG. 20(b) illustrates how the diode 31 could be included monolithically. The diode could be a simple Schottky diode or could be a normal p-n diode. The diode 31 would pull down the active gate 10 during turn-off to the diode V$_{th}$, therefore the diode needs to be designed to have as low a threshold voltage as possible. A feature which can achieve this is the use of a recessed anode such that the contact is made directly to the 2DEG as seen in FIG. 20 (c).

Figure 21:
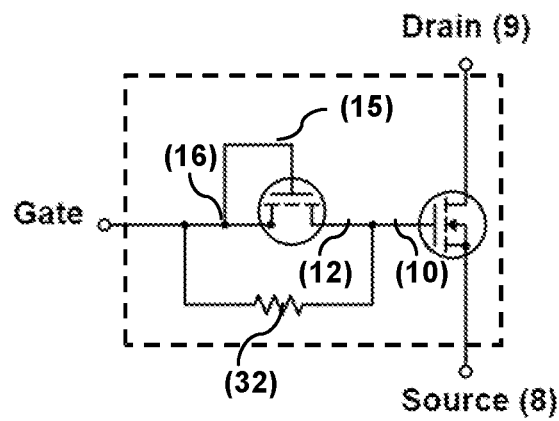
FIG. 21(a) shows a circuit schematic representation of a further embodiment of the proposed disclosure in which a relatively high value resistor is connected in parallel between the drain and the source of the auxiliary transistor.
FIG. 21(b) is a schematic 3D illustration of the embodiment shown in FIG. 21(a)
Figure 21:
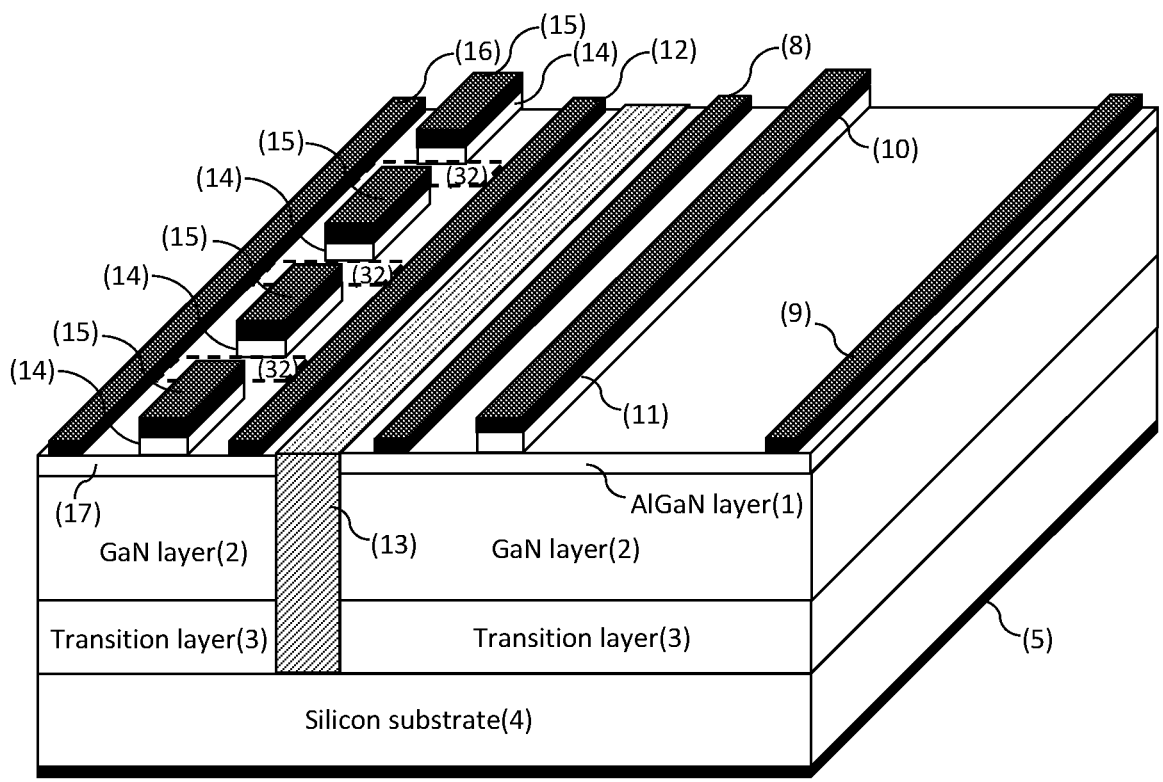

FIG. 21(a) shows a circuit schematic representation of a further embodiment of the proposed disclosure in which a high value resistor is connected in parallel between the drain and the source of the auxiliary transistor. Many of the features of this embodiment are similar to those of FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, SiO$_2$ passivation layer 6, isolation region 13, auxiliary AlGaN layer 17, auxiliary pGaN layer 14, auxiliary gate 15, first additional terminal 16 and second additional terminal 12. However, in this embodiment, a high value resistor 32 is connected in parallel between the source 12 and the drain (gate) 16 of the low-voltage transistor. The parallel resistor 32 acts as a pull-down network during the turn-off of the overall configuration connecting to ground the gate terminal 10 of the active GaN transistor. As a consequence, zero voltage will be applied to the gate 10 of the active device when zero current is flowing into the resistor 32. The resistor 32 will need to be chosen or designed as a relatively high value resistor (for example, about 500 ohm or more). In this way, the resistor will not take any conducting current during the on-state operation of the device.

FIG. 21(b) is a schematic 3D illustration of the embodiment shown in FIG. 21(a). This illustrates how the parallel resistance 32 could be included in the design monolithically. Sections of the auxiliary gate 15/pGaN 14 are removed such that the 2DEG beneath those sections is always present and can act as a resistance which can pull down the real gate voltage during turn-off. This resistance needs to be large during turn-on/on-state to see the benefits of the auxiliary gate 15 on the device characteristics. However, it needs to be small during turn-off to allow a fast turn-off. Therefore, there is a trade-off between auxiliary gate turn-on benefits and speed of turn-off.

Figure 22A:
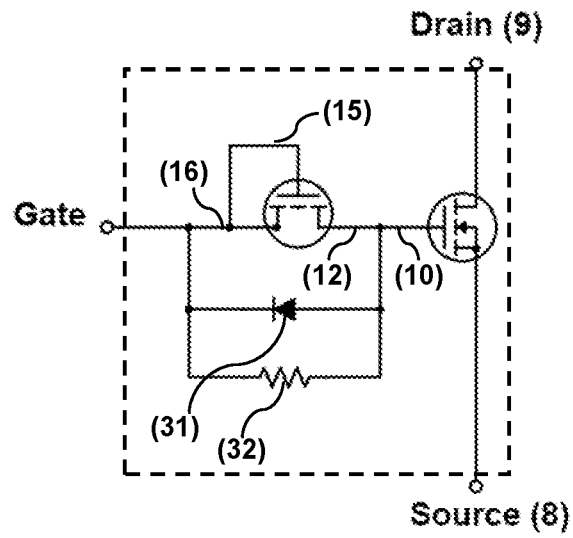
FIG. 22(a) shows a circuit schematic representation of a further embodiment of the proposed disclosure in which a low on-state voltage diode and high-voltage resistor are connected in parallel between the source and the drain (gate) of the auxiliary transistor.

FIG. 22(a) shows a circuit schematic representation of a further embodiment of the proposed disclosure in which a low on-state voltage diode and high-voltage resistor are connected in parallel between the source and the drain (gate) of the low-voltage transistor. Many of the features of this embodiment are similar to those of FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, SiO$_2$ passivation layer 6, isolation region 13, auxiliary AlGaN layer 17, auxiliary pGaN layer 14, auxiliary gate 15, first additional terminal 16 and second additional terminal 12. However, in this embodiment, a parallel network of a low on-state voltage diode 31 and high resistor 32 is connected in parallel between the source 12 and the drain (gate) 16 of the low-voltage transistor. The parallel connection of the diode 31 and resistor 32 will act as a pull-down network during the turn-off of the overall configuration.

Figure 22B:
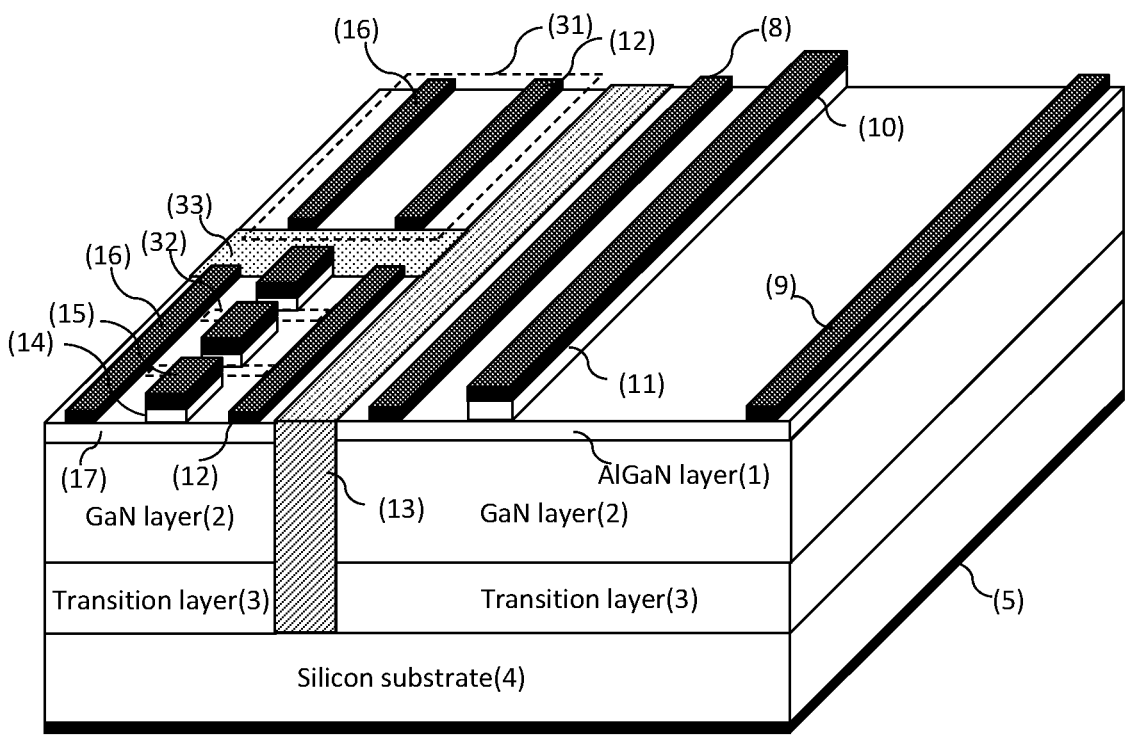
FIG. 22(b) is a schematic 3D illustration of the embodiment shown in FIG. 22(a)

FIG. 22(b) is a schematic 3D illustration of the embodiment shown in FIG. 22(a). This illustrates how the diode 31 and resistor 32 could be included in the design monolithically.

FIG. 23 shows a circuit schematic representation of a further embodiment of the proposed disclosure in which the drain (gate) terminal 16 of the auxiliary transistor is available as an external gate terminal and the source terminal 12 of the auxiliary transistor is connected to the anode of a low on-state voltage diode and a high voltage resistor in parallel, and the cathode of the low on-state voltage diode is then available as a second external gate terminal. Many of the features of this embodiment are similar to those of FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, $SiO_2$ passivation layer 6, isolation region 13, auxiliary AlGaN layer 17, auxiliary pGaN layer 14, auxiliary gate 15, first additional terminal 16 and second additional terminal 12. However, in this case the external gate terminal is divided into two terminals. If a gate driver with two output pins is used, external gate 1 can be connected to the source branch and external gate 2 can be connected to the sink branch of the driver while providing the opportunity to optimize the passive components included in each branch respectively.

FIG. 24 shows a circuit schematic representation of a further embodiment of the proposed disclosure in which the drain (gate) terminal 16 and the source terminal 12 of the auxiliary transistor are available as external gate terminals. Many of the features of this embodiment are similar to those of FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, $SiO_2$ passivation layer 6, isolation region 13, auxiliary AlGaN layer 17, auxiliary pGaN layer 14, auxiliary gate 15, first additional terminal 16 and second additional terminal 12. However, in this case the external gate terminal is again divided into two terminals. Since the gate driver sink output pin can now be connected to the source terminal of the auxiliary transistor directly offering a pull-down path, components 31, 32 may (or may not) be omitted.

FIG. 25 shows a circuit schematic representation of a further embodiment of the proposed disclosure where a second auxiliary transistor 34 (could be advantageously low-voltage) is connected in parallel with the first auxiliary transistor where the drain (gate) terminal 16 of the first auxiliary transistor is connected to the source terminal of the second auxiliary transistor and the source terminal 12 of the first auxiliary transistor is connected to the drain (gate) terminal of the second auxiliary transistor. Many of the features of this embodiment are similar to those of FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, $SiO_2$ passivation layer 6, isolation region 13, auxiliary AlGaN layer 17, auxiliary pGaN layer 14, auxiliary gate 15, first additional terminal 16 and second additional terminal 12. However, in this case the pull-down network during the turn-off of the overall configuration is a second auxiliary transistor 34.

FIG. 26 shows a block diagram of a further embodiment of the proposed disclosure where any of the embodiments of the power device 35 according to this disclosure are placed in a half bridge configuration, where the external gates of the two power devices (both high and low side) are connected to gate driving blocks which are in turn connected to logic blocks. The different components and blocks included in the figure can be discrete components or connected monolithically. This is included to demonstrate different options of possible monolithic integration 36, 37, 38 while utilising the concept of the auxiliary gate.

FIG. 27 shows a circuit schematic representation of a further embodiment of the proposed disclosure where the power device 35 according to this disclosure is connected in a standard full bridge configuration.

FIG. 28 shows a circuit schematic representation of a further embodiment of the proposed disclosure where the power device 35 according to this disclosure is connected in a standard three-phase half bridge configuration.

FIG. 29 shows a circuit schematic representation of a further embodiment of the proposed disclosure where external gate of the power device 35 according to this disclosure is connected to standard gate driving circuitry. This figure shows an example of how the auxiliary transistor structure 40 can act as an interface between a standard high voltage transistor 39 and a standard gate driver circuit 41 composing of a logic control stage and a buffer stage. The logic circuit formed by E/D-mode HEMTs can reshape and transfer the input PWM signal, while the buffer stage formed by two push-pull E-mode HEMTs can provide charge/discharge current for the gate capacitance of the high voltage transistor [21]. This can be implemented with discrete components or monolithically.

It will be appreciated that the auxiliary transistor described above in relation to all the embodiments can be a low voltage transistor or a high voltage transistor.

It will also be appreciated that terms such as "top" and "bottom", "above" and "below", "lateral" and "vertical", and "under" and "over", "front" and "behind", "underlying", etc. may be used in this specification by convention and that no particular physical orientation of the device as a whole is implied.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

REFERENCES

[1] U. K. Mishra et al., GaN-Based RF power devices and amplifiers, Proc. IEEE, vol 96, no 2, pp 287-305, 2008.
[2] M. H. Kwan et al, CMOS-Compatible GaN-on-Si Field-Effect Transistors for High Voltage Power Applications, IEDM, San Fran., December 2014, pp 17.6.1-17.6.4 [3] S. Lenci et al., Au-free AlGan/GaN power diode 8-in Si substrate with gated edge termination, Elec. Dev. Lett., vol 34, no 8, pp 1035, 2013.
[4] T. Oka and T. Nozawa, IEEE Electron Device Lett., 29, 668 (2008).

[5] Y. Cai, Y. Zhou, K. J. Chen, and K. M. Lau, IEEE Electron Device Lett., 26, 435 (2005) [6] W. Saito, Y. Takada, M. Kuraguchi, K. Tsuda, and I. Omura, IEEE Trans. Electron Devices, 53, 356, (2006).

[7] Y. Uemoto, M. Hikita, H. Ueno, H. Matsuo, H. Ishida, M. Yanagihara, T. Ueda, T. Tanaka, and D. Ueda, IEEE Trans. Electron Devices, 54, 3393 (2007).

[8] I. Hwang, H. Choi, J. Lee, H. S. Choi, J. Kim, J. Ha, C. Y. Um, S. K. Hwang, J. Oh, J. Y. Kim, J. K. Shin, Y. Park, U. I. Chung, I. K. Yoo, and K. Kim, Proc. ISPSD, Bruges, Belgium, p. 41 (2012).

[9] M. J. Uren, J. Moreke, and M. Kuball, IEEE Trans. Electron Devices, 59, 3327 (2012).

[10] L. Efthymiou et al, On the physical operation and optimization of the p-GaN gate in normally-off GaN HEMT devices, Appl. Phys. Lett., 110, 123502 (2017)

[11] GS66504B, GaN Systems, Ottawa, Canada.

[12] Infineon 650V CoolMOS C7 Power Transistor IPL65R130C7.

[13] L. Efthymiou et al, On the Source of Oscillatory Behaviour during Switching of Power Enhancement Mode GaN HEMTs, Energies, vol. 10, no. 3, 2017

[14] F. Lee, L. Y. Su, C. H. Wang, Y. R. Wu, and J. Huang, "Impact of gate metal on the performance of p-GaN/ AlGaN/GaN High electron mobility transistors," IEEE Electron Device Lett., vol. 36, no. 3, pp. 232-234, 2015.

[15] O. Ambacher, J. Smart, J. R. Shealy, N. G. Weimann, K. Chu, M. Murphy, W. J. Schaff, L. F. Eastman, R. Dimitrov, L. Wittmer, M. Stutzmann, W. Rieger, and J. Hilsenbeck, "Two-dimensional electron gases induced by spontaneous and piezoelectric polarization charges in N- and Ga-face AlGaN/GaN heterostructures," J. Appl. Phys., vol. 85, no. 6, p. 3222, 1999.

[16] Okita, H., Hikita, M., Nishio, A., Sato, T., Matsunaga, K., Matsuo, H., Mannoh, M. and Uemoto, Y., 2016, June. Through recessed and regrowth gate technology for realizing process stability of GaN-GITs. In Power Semiconductor Devices and ICs (ISPSD), 2016 28th International Symposium on (pp. 23-26). IEEE.

[17] Lu, B., Saadat, O. I. and Palacios, T., 2010. High-performance integrated dual-gate AlGaN/GaN enhancement-mode transistor. IEEE Electron Device Letters, 31(9), pp. 990-992.

[18] Yu, G., Wang, Y., Cai, Y., Dong, Z., Zeng, C. and Zhang, B., 2013. Dynamic characterizations of AlGaN/GaN HEMTs with field plates using a double-gate structure. IEEE Electron Device Letters, 34(2), pp. 217-219

[19] Feng, P., Teo, K. H., Oishi, T., Yamanaka, K. and Ma, R., 2013, May. Design of enhancement mode single-gate and doublegate multi-channel GaN HEMT with vertical polarity inversion heterostructure. In Power Semiconductor Devices and ICs (ISPSD), 2013 25th International Symposium on (pp. 203-206). IEEE

[20] Xiaobin, X. I. N., Pophristic, M. and Shur, M., Power Integrations, Inc., 2013. Enhancement-mode HFET circuit arrangement having high power and high threshold voltage. U.S. Pat. No. 8,368,121.

[21] Gaofei Tang et al, High-Speed, High-Reliability GaN Power Device with Integrated Gate Driver, Proceedings of the 30th International Symposium on Power Semiconductor Devices & Ics, May 13-17, 2018, Chicago, USA

The invention claimed is:

1. A III-nitride semiconductor based heterojunction power device, comprising:
an active heterojunction transistor formed on a substrate, the active heterojunction transistor comprising:
a first III-nitride semiconductor region comprising a first heterojunction comprising an active two dimensional carrier gas; a first terminal operatively connected to the III-nitride
semiconductor region, wherein the first terminal is configured as a low voltage terminal;
a second terminal laterally spaced from the first terminal and operatively connected to the III-nitride semiconductor region, wherein the second terminal is configured as a high voltage terminal;
an active gate region formed over the III-nitride semiconductor region, the active gate region being formed between the first terminal and the second terminal;
an auxiliary heterojunction transistor formed on the said substrate or a further substrate, the auxiliary heterojunction transistor comprising:
a second III-nitride semiconductor region comprising a second heterojunction comprising an auxiliary two dimensional carrier gas;
a first additional terminal operatively connected to the second III-nitride semiconductor region, wherein the first additional terminal is configured as a gate switching terminal;
a second additional terminal laterally spaced from the first additional terminal and operatively connected to the second III-nitride semiconductor region;
an auxiliary gate region formed over the second III-nitride semiconductor region, the auxiliary gate region being formed between the first additional terminal and the second additional terminal;
wherein the first additional terminal is operatively connected with the auxiliary gate region, and wherein the second additional terminal is operatively connected with the active gate region; and
wherein the auxiliary heterojunction transistor is configured to increase a threshold voltage of said heterojunction power device and/or to increase an operation voltage range of the first additional terminal.

2. A heterojunction power device according to claim 1, wherein, in use, when the first additional terminal and the auxiliary gate region are biased at a potential, the carrier density in a portion of the auxiliary two dimensional carrier gas underneath the auxiliary gate region is controlled such that an auxiliary two dimensional carrier gas connection is established between the first and second additional terminals.

3. A heterojunction power device according to claim 1, wherein the first additional terminal connected with the auxiliary gate region is at a higher potential or the same potential compared to that of the second additional terminal during on-state and turn-on, and wherein the second additional terminal is at a higher potential or the same potential compared to that of the first additional terminal during off-state and turn-off.

4. A heterojunction power device according to claim 1, wherein at least one of (i) the first III-nitride semiconductor region comprises an active aluminium gallium nitride (AlGaN) layer directly in contact with the first terminal, the active gate region and the second terminal, and (ii) the second III-nitride semiconductor region comprises an auxiliary aluminium gallium nitride (AlGaN) layer directly in contact with the first additional terminal, the auxiliary gate region and the second additional terminal.

5. A heterojunction power device according to claim 4, wherein at least one of:

(i) a thickness of the active AlGaN layer and the auxiliary AlGaN layer is the same or different,
(ii) a doping concentration of the active AlGaN layer and the auxiliary AlGaN layer is the same or different, and
(iii) a aluminium mole fraction of the active AlGaN layer and the auxiliary AlGaN layer may be the same or different.

6. A heterojunction power device according to claim 1, wherein at least one of (i) the active gate region comprises a p-type gallium nitride (pGaN) material, and (ii) the auxiliary gate region comprises a p-type gallium nitride (pGaN) material.

7. A heterojunction power device according to claim 1, wherein at least one of (i) the auxiliary gate region comprises a recessed Schottky contact, and (ii) the active gate region comprises a recessed Schottky contact.

8. A heterojunction power device according claim 1, wherein either (i) the first terminal, the second terminal, the first additional terminal and the second additional terminal each comprise a surface ohmic contact or (ii) the first terminal, the second terminal, the first additional terminal and the second additional terminal each comprise a recessed ohmic contact.

9. A heterojunction power device according to claim 1, wherein the auxiliary gate region comprises a field plate extending towards the first additional terminal and wherein the field plate extends over a dielectric region.

10. A heterojunction power device according to claim 1, wherein the device has an interdigitated layout in which at least one of (i) a gate metal pad is directly connected with the auxiliary gate region and the first additional terminal, and wherein the active gate region comprises gate fingers connected with the second additional terminal and (ii) the auxiliary gate region, the first additional terminal and the second additional terminal are placed below a source metal pad.

11. A heterojunction power device according to claim 1, wherein the second additional terminal and the active gate region are connected in a third dimension of the device.

12. A heterojunction power device according to claim 1, further comprising an additional auxiliary heterojunction transistor or several such additional auxiliary heterojunction transistors in series.

13. A heterojunction power device according to claim 1, wherein the active heterojunction transistor is a high voltage transistor and the auxiliary heterojunction transistor is a low voltage transistor compared to the active heterojunction transistor.

14. A heterojunction power device according to claim 1, further comprising a diode connected in parallel between the first and second additional terminals of the auxiliary heterojunction transistor.

15. A heterojunction power device according to claim 1, further comprising a resistor connected in parallel between the first and second additional terminals of the auxiliary heterojunction transistor.

16. A heterojunction power device according to claim 1, further comprising a diode and a resistor each connected in parallel between the first and second additional terminals of the auxiliary heterojunction transistor, or
(ii) wherein the first additional terminal of the auxiliary heterojunction transistor acts as an external gate terminal.

17. A heterojunction power device according to claim 1, wherein the auxiliary heterojunction transistor is a first auxiliary heterojunction transistor, and wherein the heterojunction power device further comprises a second auxiliary heterojunction transistor which is operatively connected in parallel with the first auxiliary transistor, and wherein the first additional terminal of the first auxiliary heterojunction transistor is connected to a source terminal of the second auxiliary heterojunction transistor, and the second additional terminal of the first auxiliary heterojunction transistor is operatively connected to a drain terminal of the second auxiliary heterojunction transistor.

18. A heterojunction power device according to claim 1, wherein at least one of:
(i) two heterojunction power devices are placed in a half bridge configuration, the external gates of the two heterojunction power devices are operatively connected to gate driving blocks which are in turn connected to logic blocks,
(ii) the heterojunction power device is operatively connected in a full bridge configuration,
(iii) the heterojunction power device is operatively connected in a three-phase half bridge configuration, and
(iv) the heterojunction power device is operatively connected to gate driving circuitry.

19. A method of manufacturing a III-nitride semiconductor based heterojunction power device, the method comprising:
forming an active heterojunction power transistor on a substrate, the active heterojunction transistor comprising:
a first III-nitride semiconductor region comprising a first heterojunction comprising an active two dimensional carrier gas;
a first terminal operatively connected to the III-nitride semiconductor region, wherein the first terminal is configured as a low voltage terminal;
a second terminal laterally spaced from the first terminal and operatively connected to the III-nitride semiconductor region, wherein the second terminal is configured as a high voltage terminal;
an active gate region formed over the III-nitride semiconductor region, the active gate region being formed between the first terminal and the second terminal;
forming an auxiliary heterojunction transistor on the substrate or on a further substrate, the auxiliary heterojunction transistor comprising:
a second III-nitride semiconductor region comprising a second heterojunction comprising an auxiliary two dimensional carrier gas;
a first additional terminal operatively connected to the second III-nitride semiconductor region, wherein the first additional terminal is configured as a gate switching terminal;
a second additional terminal laterally spaced from the first additional terminal and operatively connected to the second III-nitride semiconductor region;
an auxiliary gate region formed over the second III-nitride semiconductor region, the auxiliary gate region being formed between the first additional terminal and the second additional terminal;
operatively connecting the first additional terminal with the auxiliary gate region, and
operatively connecting the second additional terminal with the active gate region,
wherein the auxiliary heterojunction transistor results in an increase in a threshold voltage of said heterojunction power device and/or results in an increase in an operation voltage range of the first additional terminal.

20. A method according to claim 19, further comprising at least one of:
- (i) forming the first Ill-nitride semiconductor region at the same time as forming the second III-nitride semiconductor region,
- (ii) forming the active gate region at the same time as forming the auxiliary gate region,
- (iii) the active gate region and the auxiliary gate region each comprise p-type gallium nitride (PGaN) material, and
- (iv) forming a metallization layer for the first terminal, the second terminal, the first additional terminal, and the second additional terminal at the same time.

\* \* \* \* \*